United States Patent
Walker

(10) Patent No.: US 9,953,995 B2
(45) Date of Patent: Apr. 24, 2018

(54) INDEPENDENT VERTICAL-GATE 3-D NAND MEMORY CIRCUIT

(71) Applicant: Schiltron Corporation, Mountain View, CA (US)

(72) Inventor: Andrew J. Walker, Mountain View, CA (US)

(73) Assignee: SCHILTRON CORPORATION, Mountain View, CA (US)

( * ) Notice: Subject to any disclaimer, the term of this patent is extended or adjusted under 35 U.S.C. 154(b) by 0 days.

(21) Appl. No.: 15/214,213

(22) Filed: Jul. 19, 2016

(65) Prior Publication Data
US 2017/0025437 A1    Jan. 26, 2017

Related U.S. Application Data

(60) Provisional application No. 62/194,713, filed on Jul. 20, 2015.

(51) Int. Cl.
*H01L 27/1157* (2017.01)
*H01L 27/11582* (2017.01)
*H01L 27/11575* (2017.01)

(52) U.S. Cl.
CPC .... *H01L 27/11582* (2013.01); *H01L 27/1157* (2013.01); *H01L 27/11575* (2013.01)

(58) Field of Classification Search
CPC .................................................. H01L 27/1157
See application file for complete search history.

(56) References Cited

U.S. PATENT DOCUMENTS

| 8,823,078 B2 * | 9/2014 | Kim ................... G11C 16/0483 257/316 |
| 9,230,985 B1 * | 1/2016 | Wu .................... H01L 27/11582 |
| 2010/0001267 A1 * | 1/2010 | Manning ................ B82Y 10/00 257/40 |

* cited by examiner

*Primary Examiner* — Marc Armand
(74) *Attorney, Agent, or Firm* — VLP Law Group, LLC; Edward C. Kwok

(57) ABSTRACT

A memory array provided on a semiconductor substrate includes: (a) channel structures arranged in multiple layers above the semiconductor substrate, each channel structure extending along a first direction substantially parallel a surface of the semiconductor substrate; (b) gate structures each extending along a second direction substantially transverse to the first direction and each being adjacent one of the channel structures, separated therefrom by a layer of memory material; and (c) conductors provided to connect the gate structures with circuitry fabricated in the semiconductor substrate, wherein at each location where one of the gate structure adjacent one of the channel structures, a portion of the gate structure, a portion of the channel structure and the layer of memory material constitute a memory cell of the memory array. Two or more memory cells sharing a channel structure are connected in series to form a NAND string.

24 Claims, 28 Drawing Sheets

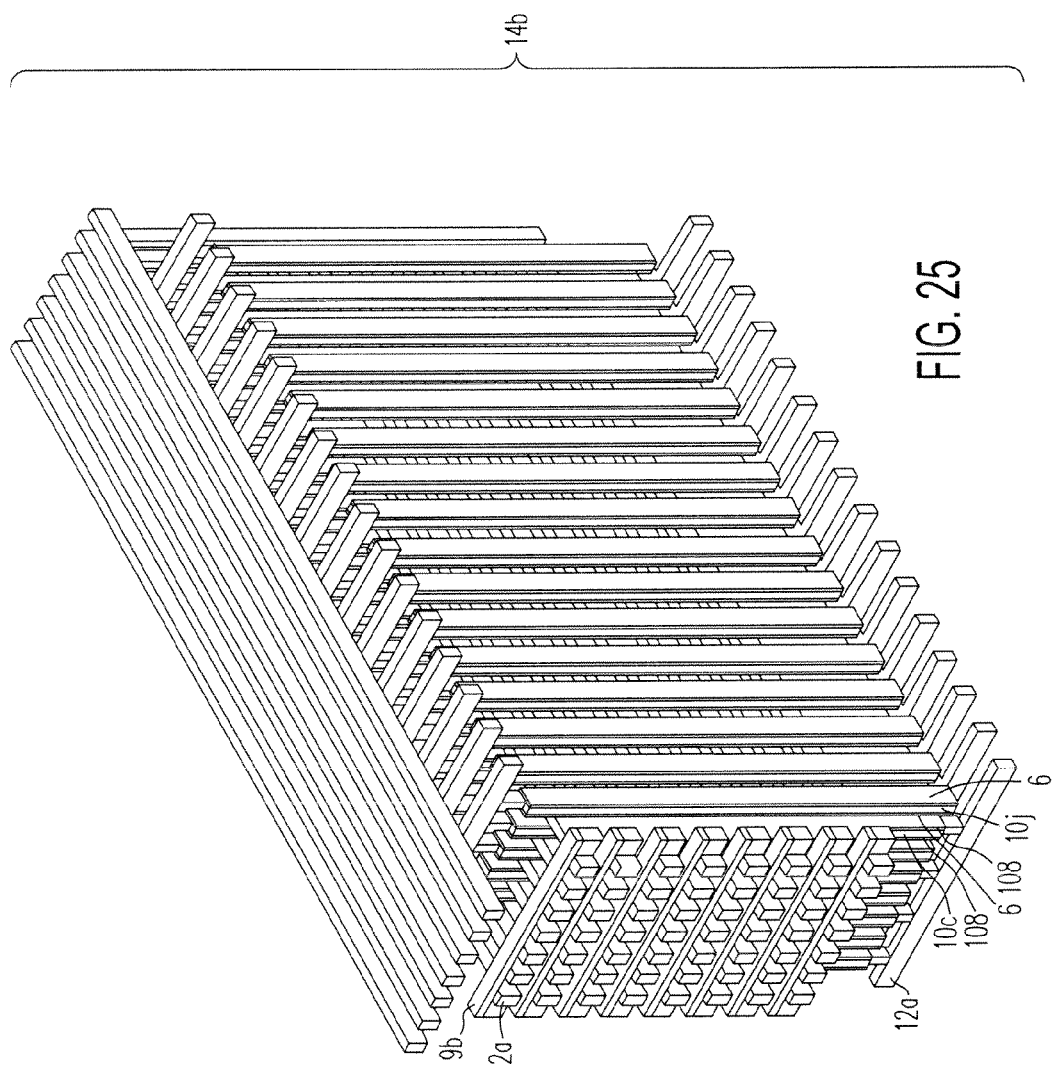

INDEPENDENT VERTICAL-GATE 3-D NAND MEMORY CIRCUIT

CROSS REFERENCE TO RELATED APPLICATIONS

The present application relates to and claims priority of U.S. provisional patent application ("Provisional Patent Application"), Ser. No. 62/194,713, entitled "INDEPENDENT VERTICAL GATE 3D NAND," filed on Jul. 20, 2015. The Provisional Patent Application is hereby incorporated by reference in its entirety.

BACKGROUND OF THE INVENTION

1. Field of the Invention

The embodiments of the invention are directed generally to non-volatile NAND-type memory circuits.

2. Discussion of the Related Art

Non-volatile NAND-type semiconductor memory circuits are typically organized as strings of memory cells and fabricated on the surface of a semiconductor substrate. As density—as evaluated by the number of memory cells per unit surface area of the semiconductor substrate, for example—is an important design parameter, significant development efforts have been devoted to create memory circuits that pack multiple layers of memory cells in the "vertical" direction. In this detailed description, the term "horizontal" refers to any direction parallel to the surface of the semiconductor substrate, and the term "vertical" refers to any direction perpendicular to the surface of the semiconductor substrate. Similarly, all references to "top" and "bottom" are made considering the semiconductor substrate being at the bottom. However, a successful design requires not only a desirable density but also a fabrication process.

SUMMARY

The present invention provides a NAND-type memory device with multiple layers of memory cells or other circuit elements, with each layer including memory cells or other circuit elements provided on either side or both sides of a semiconductor channel structure.

According to one embodiment of the present invention, a memory array provided on a semiconductor substrate includes: (a) channel structures arranged in multiple layers above the semiconductor substrate, each channel structure extending along a first direction substantially parallel a surface of the semiconductor substrate; (b) gate structures each extending along a second direction substantially transverse to the first direction and each being adjacent one of the channel structures, separated therefrom by a layer of memory material; and (c) conductors provided to connect the gate structures with circuitry fabricated in the semiconductor substrate, wherein at each location where one of the gate structure adjacent one of the channel structures, a portion of the gate structure, a portion of the channel structure and the layer of memory material constitute a memory cell of the memory array. Two or more memory cells sharing a channel structure are connected in series to form a NAND string.

In one embodiment, the memory layer includes a charge storage layer, which may be a composite having a charge transit layer, a charge trapping layer, and an insulating layer.

According to one embodiment of the present invention, the gate structures may be organized such that two of the gate structures are provided on opposite sides of one of the channel structures, each separated from the channel structure by a layer of the memory material. In one embodiment, the gate structures may be aligned along a third direction transverse to both the first and the second directions. In another embodiment, the two gate structures are not aligned along the third direction, i.e., staggered.

According to one embodiment of the present invention, a gate enhancement layer is provided between adjacent gate structures.

According to one embodiment of the present invention, the memory array further includes a second plurality of gate structures, wherein the gate structures are organized such that one of the gate structures of the first plurality of gate structures and one of the gate structures of the second plurality of gate structures are provided on opposite sides of one of the channel structures, and wherein that gate structure of the second plurality of gate structures is separated from the channel structure by a layer of the dielectric material. The gate structure of the first plurality of gate structures and the gate structure of the second plurality of gate structures are aligned along a third direction transverse to both the first and the second directions.

The present invention is better understood upon consideration of the detailed description below in conjunction with the drawings.

BRIEF DESCRIPTION OF THE DRAWINGS

FIG. 11 shows that dielectric layer 80 fills the gaps etched in between the vertical gate structures and covers the top of memory array 14a.

FIG. 25 shows, for memory array 14b of FIG. 20, a second architecture for providing ground conductors through connections by horizontal conductors (e.g., ground conductor 96).

DETAILED DESCRIPTION OF THE PREFERRED EMBODIMENTS

In this detailed description, when an element is referred to as "coupled" to another element, it can be directly on or extend directly on to the other element, or intervening elements may be present. This nomenclature is introduced for ease of understanding only, and should not be construed as limiting to specific assembly, orientation, etc. When reference is made herein to a method including two or more defined steps, the defined steps can be carried out in any order or simultaneously except where context excludes such a possibility, and the method can include one or more other steps carried out before any of the defined steps, between two of the defined steps, or after all the defined steps except where context excludes that possibility.

The present invention provides a NAND-type semiconductor memory circuit with a dual-gate structure, which allows independent control of control gates provided on either side of a channel structure. A high density is achieved by providing serially connected memory cells organized as one or more NAND strings on one side or on both (opposite) sides of the channel structure, stacking multiple layers of such NAND-strings along the vertical direction, and by increasing the length of the NAND strings (i.e., the number of serially connected memory cells in each NAND string).

The following embodiments of the present invention, each of which involves different architectures of the memory arrays, are described in detail.

Figure 1:
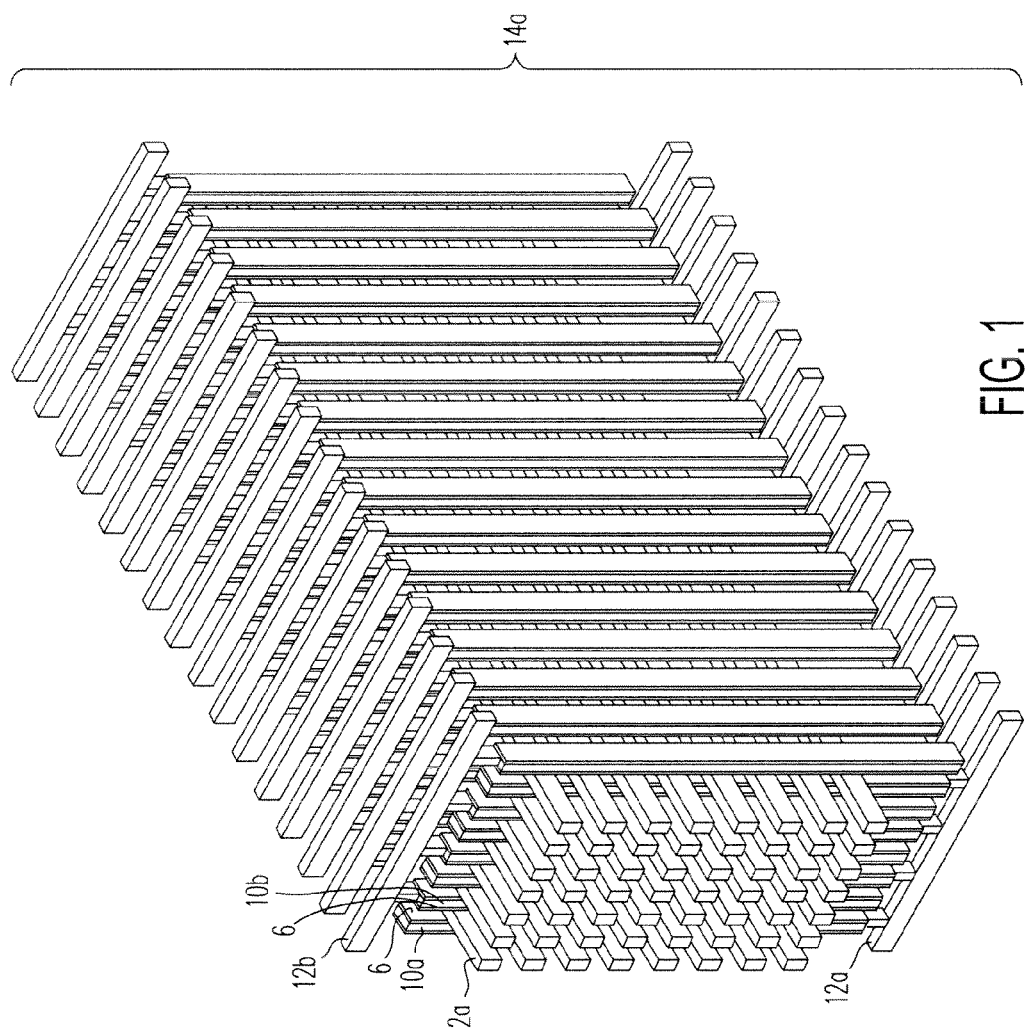
FIG. 1 shows memory array 14a formed out of horizontal channel structures (e.g., channel structure 2a), vertical gate structures (e.g. gate structures 10a and 10b) and charge storage layers 6 provided on one surface or opposite surfaces of each gate structure between that gate structure and the surface of the horizontal channel structures adjacent that gate structure, in accordance with one embodiment of the present invention.

FIG. 1 shows memory array 14a formed out of horizontal channel structures (e.g., channel structure 2a), vertical gate structures (e.g. gates structure 10a and 10b) and charge storage layers 6 provided on one surface or opposite surfaces of each gate structure between that gate structure and the surface of the horizontal channel structures adjacent that gate structure, in accordance with one embodiment of the present invention. As shown in FIG. 1, two "memory" or charge storage layers 6 are arranged to be on adjacent opposing sides of channel structure 2a—i.e., one of the charge storage layers is provided on vertical gate structure 10a, with the other charge storage layer being provided on vertical gate structure 10b. Thus, each charge storage layer is controlled by a separate vertical gate structure (e.g. gate structures 10a and 10b). In addition, as two charge storage layers are provided on opposite sides of each gate structure, each gate structure controls two channel structures. The channel structures are alternately referred to as strings or NAND strings. Each channel structure, having multiple gate structures and their corresponding charge storage layers on opposing sides, form one or more NAND strings. In any implementation of memory array 14a, there may be any number of channel structures in memory array 14 of FIG. 1. The number of channel structures shown is merely provided for illustration purposes. As shown in FIG. 1, memory array 14a includes 16 charge storage layers provided on either side of each channel structure, so that a total of 32 memory cells are provided for each channel structure. There could be fewer or more charge storage layers to each channel structure, for example, for a total of 4, 64, or 1024 memory cells per NAND string. In memory array 14a, a dielectric film (e.g., dielectric film 80, discussed below), which may be silicon oxide, is provided between adjacent gate structures along each channel structure.

Each gate structure (e.g., gate structure 10a) is connected to a wiring structure (e.g., wiring structure 12a or wiring structure 12b) located above and below memory array 14s. In one embodiment, the wiring layers beneath the memory array (e.g., wiring structure 12a) are referred to as bottom word lines and the wiring layers above (e.g., wiring structure 12b) are referred to as top word lines. Although not shown in FIG. 1, other devices may exist below, above, or on either side of memory array 14a. These other devices may be transistors, capacitors, resistors, or any other suitable devices and circuits, including support circuitry such as sense amplifiers, address decoders, registers and other circuits known in the art to be associated with memory circuits.

Figure 2:
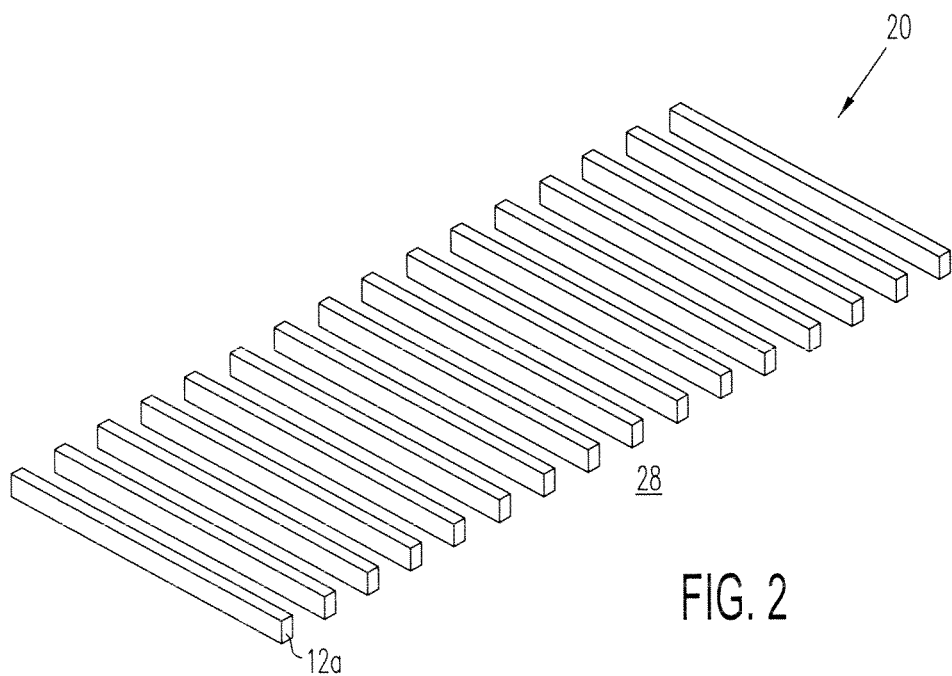
FIG. 2 is an isometric view illustrating the formation of bottom word lines 20, using a subtractive process.

The detailed fabrication steps and further details of the elements of memory array 14a are now discussed. FIG. 2 is an isometric view illustrating the formation of bottom word lines 20, using a subtractive process. As shown in FIG. 2, bottom word lines 20 are formed on substrate 24 with a substantially planar and insulating surface 28. Bottom word lines 20 may be formed by any suitable process, for example, a subtractive or damascene process. In a subtractive process, a conductive film is deposited on the substrate, followed by the formation of a masking layer on the conductive film, such as a photoresist layer that is then patterned by photolithography and appropriate etching steps, such as known to those skilled in the art. The etching step removes areas of the conductive layer exposed by the photolithography step, resulting in bottom word lines 20. The conductive film may be deposited by any suitable method, including physical vapor deposition (PVD) such as sputtering or evaporation, chemical vapor deposition (CVD), or electroplating, most preferably by PVD. The conductive film may be any suitable element or alloy and/or may comprise several elements, such as a material selected from a group consisting of titanium nitride, tungsten, tungsten nitride, titanium, aluminum, and tantalum nitride. Most preferably the conductive films include a stack of titanium (Ti), titanium nitride (TiN), and tungsten (W) materials, deposited on top of one another in order of titanium, titanium nitride and tungsten. The materials may have any suitable thickness; for example, the titanium layer may be between 10 and 1000 angstroms thick, most preferably 50 angstroms, the titanium nitride may be between 10 and 1000 angstroms thick, most preferably 200 angstroms, and the tungsten may be between 200 and 10,000 angstroms thick, most preferably 2,000 angstroms. Bottom word lines 20 may be etched by any suitable wet or dry etch, most preferably a dry etch by a gas containing a chlorine- or fluorine-containing gas species (or both).

After bottom word lines 20 are formed, a dielectric film, such as silicon oxide, may be deposited on top of and between the bottom word lines 20. The dielectric film (e.g., dielectric film 56, discussed below) may be deposited by any suitable method, most preferably by CVD. This dielectric film may then be planarized by a chemical mechanical polishing (CMP) process or by an etchback process, most preferably a CMP process.

Figure 3:
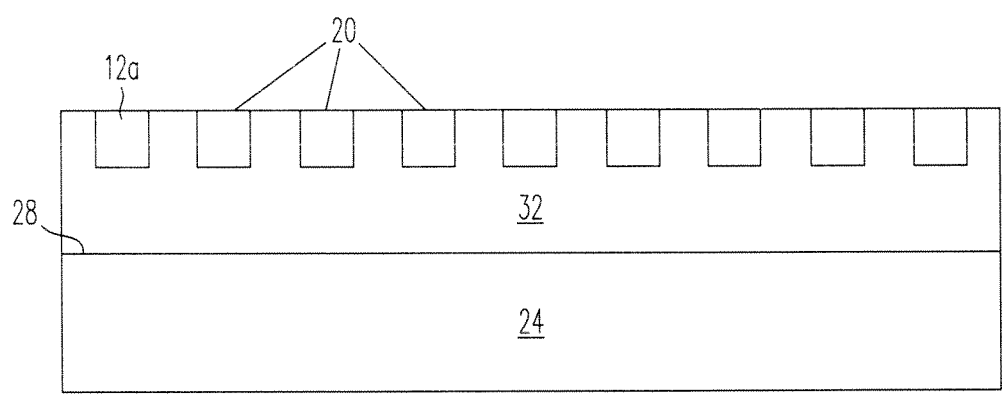
FIG. 3 is a cross section of the silicon substrate, showing bottom word lines 20 being formed by a damascene process.

In an alternative embodiment, bottom word lines 20 may be formed by a damascene process, as shown in cross section in FIG. 3. With a damascene process, a dielectric film 32 (e.g., silicon oxide) is first deposited on surface 28 of substrate 24. Dielectric film 32 may be deposited by any suitable process, most preferably by CVD. Dielectric film 32 may be between 1,000 and 10,000 angstroms thick, most preferably about 5,000 angstroms. Trenches are then etched into the dielectric film 32 by a masking and etching process. A conductive material is then deposited into the trenches and onto the planar surfaces of dielectric film 32 above the trenches. The conductive material may be deposited by any suitable process, such as by PVD or CVD, or a combination of the two, most preferably by CVD. A CMP or etchback process then removes the conductive material from the planar surfaces above the trenches whilst leaving the conductive material in the trenches, and the surface substantially planar. The conductive material in the trenches constitutes bottom word lines 20.

Figure 4:
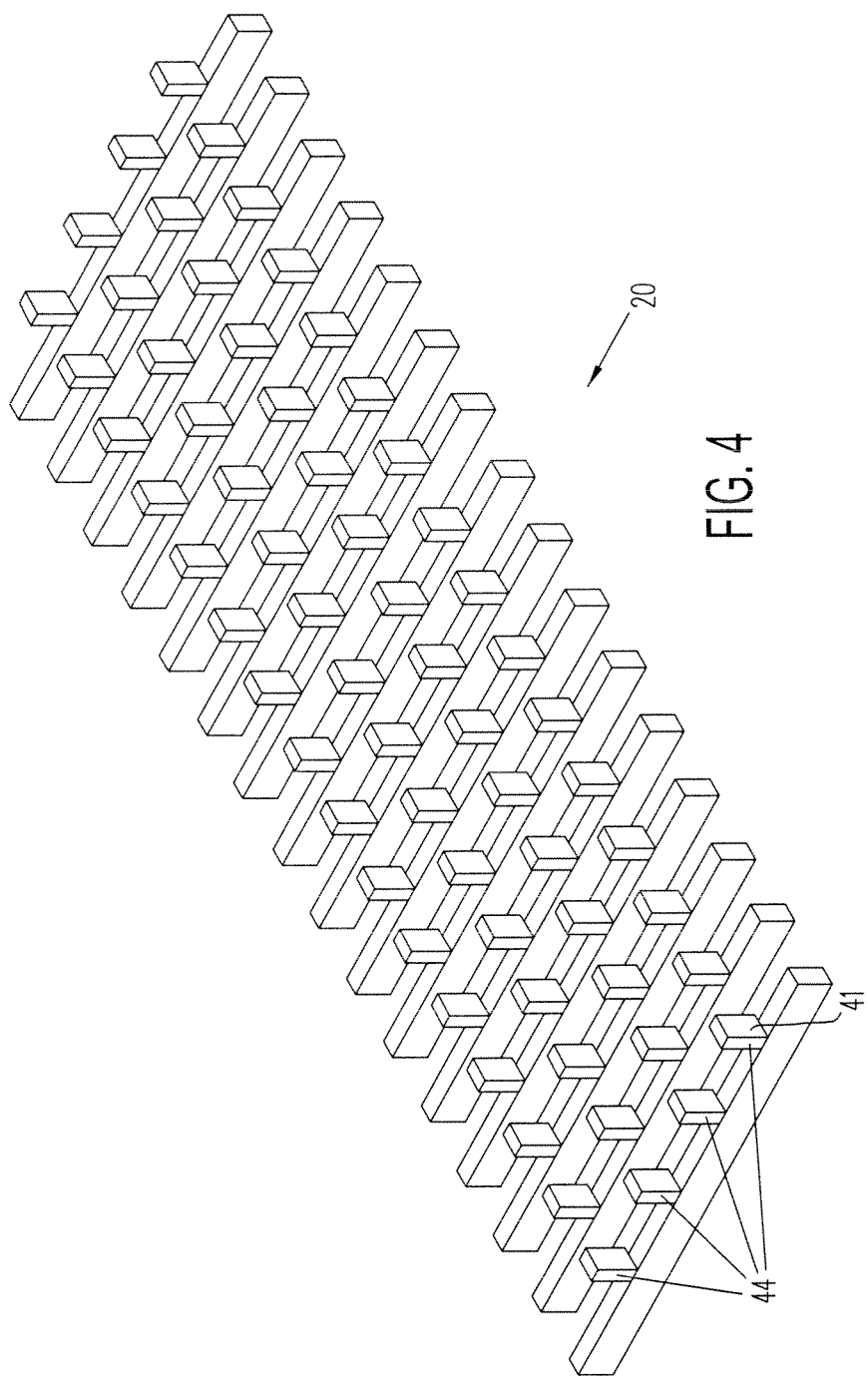
FIG. 4 is an isometric view of bottom word lines 20 connected to metal-filled vias 44 (e.g., via 41).

FIG. 4 is an isometric view of bottom word lines 20 connected to metal-filled vias 44 (e.g., via 41). After bottom word lines 20 are formed, another dielectric film 40 may then be deposited on top of bottom word lines 20 (and underlying dielectric film 32, when bottom word lines 20 are formed using a subtractive process). Metal-filled vias 44 (e.g., metal-filled via 41) are next fabricated. Metal-filled vias 44 are fabricated by patterning surface 48 of dielectric layer 40 and etching dielectric layer 40 through to and exposing selected locations on bottom word lines 20. A conductive material, such as a metal, is then deposited to fill the vias and on surface 48 of the dielectric layer 40. The conductive material on surface 48 of the planar dielectric film is then removed by a CMP or etchback process, most preferably a CMP process.

Figure 5:
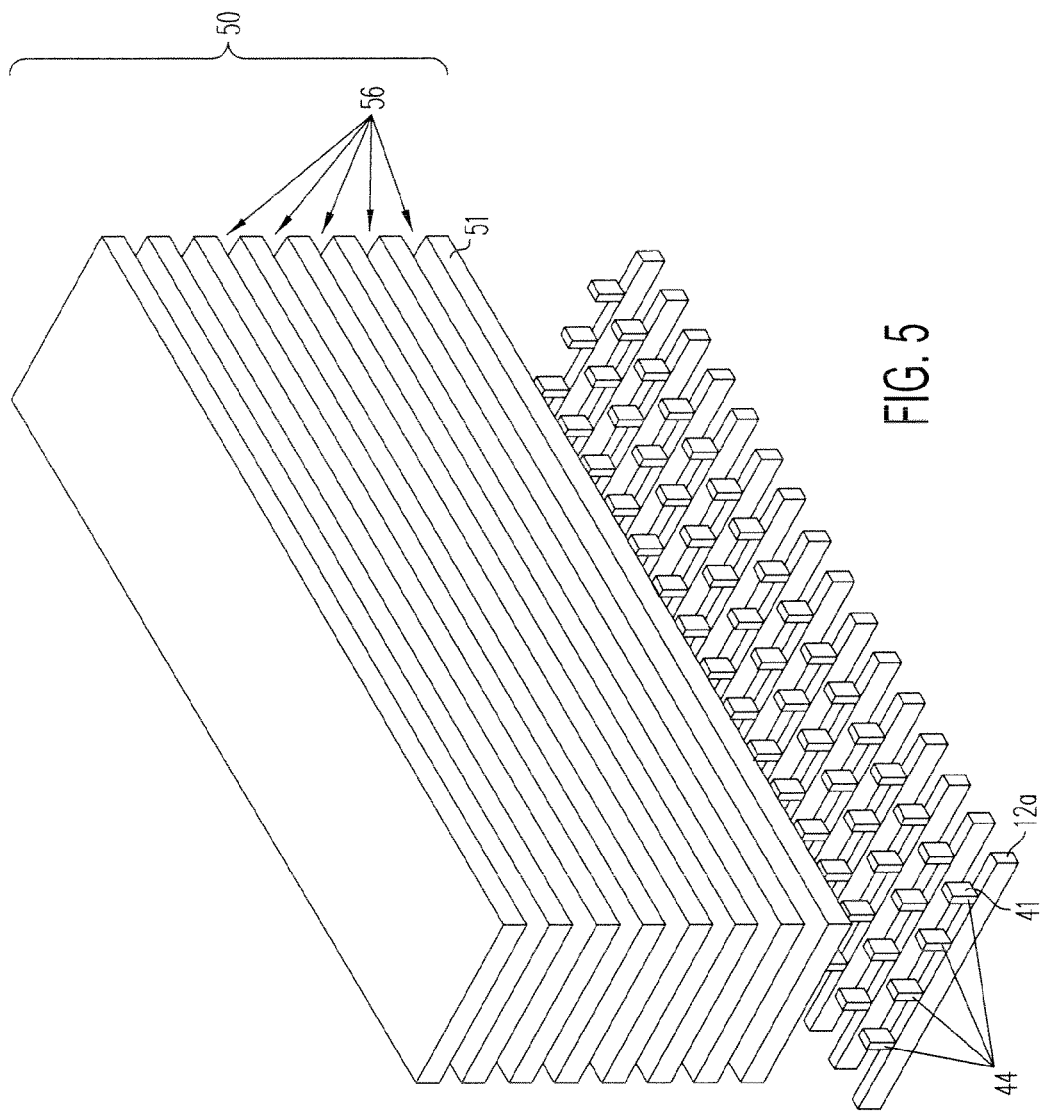
FIG. 5 is an isometric view showing multiple layers of channel material and intervening dielectric layers 56, being deposited on top of bottom word lines 20 and vias 44.

Subsequent to forming vias 44, another dielectric film 52 is deposited over the metal-filled vias 44 and underlying dielectric film 40. Dielectric film 52 may include a film such as aluminum oxide that can be used later in the process as an etch-stop layer. Channel material layer 51 is then deposited. Channel material layer 51 may include any material selected from the following group: polycrystalline silicon, polycrystalline silicon germanium, amorphous silicon, amorphous silicon germanium, and indium-gallium-zinc oxide. The process of depositing a dielectric film and a channel material layer may be suitably repeated as many times as desired. FIG. 5 is an isometric view showing multiple layers 50 of channel material and intervening dielectric layers 56, being deposited on top of bottom word lines 20 and vias 44. The material in each of channel material layers 50 (e.g., channel material layer 51) may be amorphous or crystalline; alternatively, the channel material may be deposited amorphous and crystallized by thermal anneal at a subsequent step. Each deposited channel material layer may be crystallized using a laser treatment. Each channel material layer may be deposited by any suitable method such as PVD or CVD, most preferably by CVD. In one embodiment, amorphous silicon channel material layers are deposited by CVD using a $SiH_4$ precursor at temperature of 540° C. and a pressure of 400 mTorr. The channel material layers 50 may be deliberately doped p- or n-type during deposition, or may not be intentionally doped. In this embodiment, channel material layers 50 are not intentionally doped, and have a carrier concentration less than $1\times10^{18}/cm^3$. The thickness of each channel material layer may be between 10 and 5,000 angstroms, most preferably about 200 angstroms. Additional ion implantation or other doping techniques may be applied to provide common drain or source regions to serially connect the memory cells along each channel structure to be formed. Channel material layers 50 may be patterned and etched, for example, into the rectangle shapes shown in FIG. 5, though the channel material layers may be any suitable shape. Each of dielectric layers 56 may be planarized by CMP. There may be 2, 8, 16, or 128 channel material layers in total, most preferably about 8 layers using the current state of the art.

Figure 6:
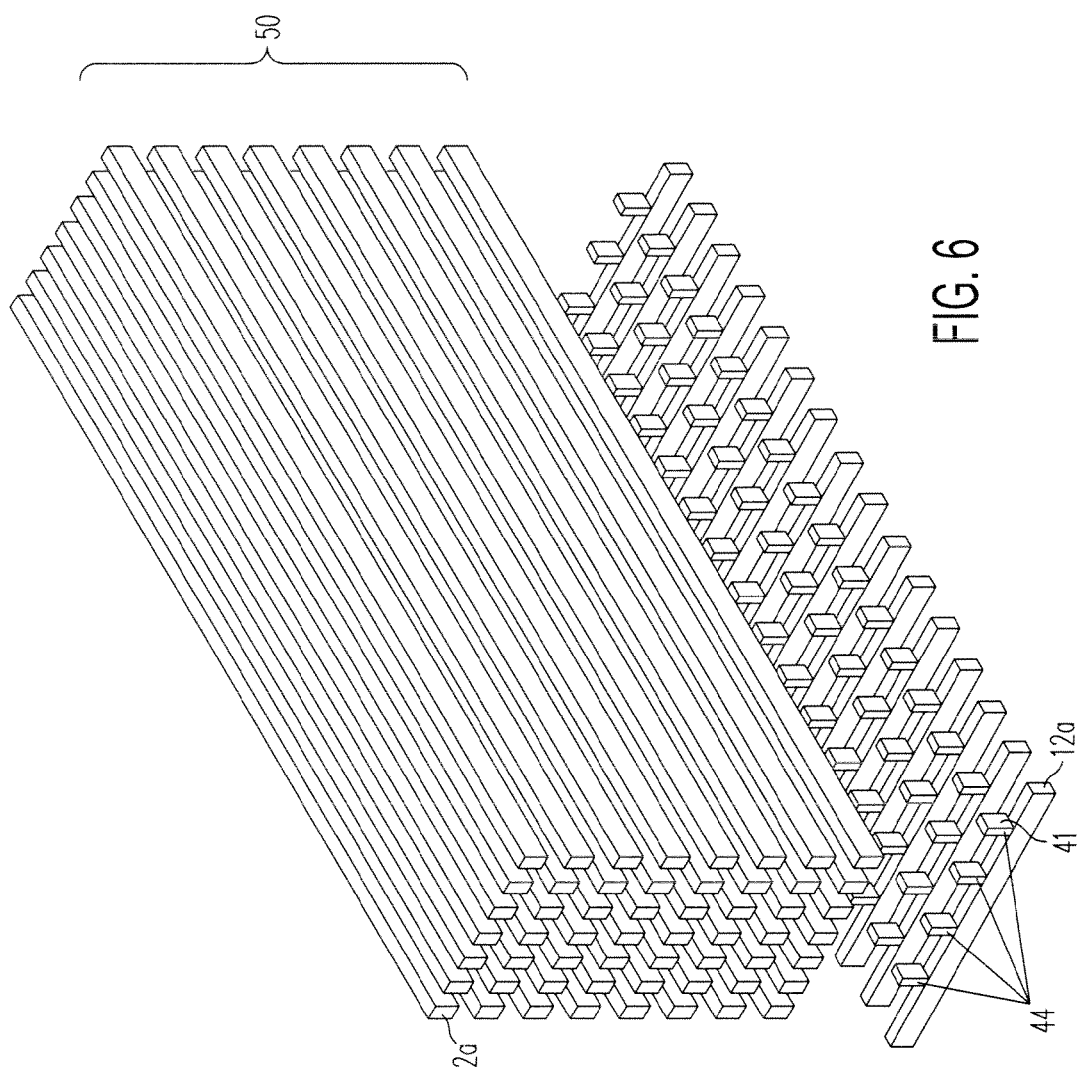
FIG. 6 is an isometric view of showing etching of trenches in the multiple channel material layers 50 to form channel structures (e.g., channel structure 2a).

FIG. 6 is an isometric view of showing etching of trenches in the multiple channel material layers 50 to form channel structures (e.g., channel structure 2a). FIG. 6, shows channel material layers 50 of FIG. 5 providing channel structures (e.g., channel structure 2a) following masking and etching steps. The etching step may be a dry etch, with all channel material layers 50, as well as dielectric films 56 on top of and between channel material layers 50 being etched simultaneously. The resulting trenches separate individual channel structures within each plane, with each trench extending beneath bottom channel material layer 51 closest to substrate 24. The etchant may be any suitable etchant, such as a fluorine- or chlorine-containing gas species, most preferably, a chlorine-containing gas species. After the etching step is complete, the masking layer is removed, leaving the formed separate channel structures (e.g., channel structure 2a).

Figure 7A:
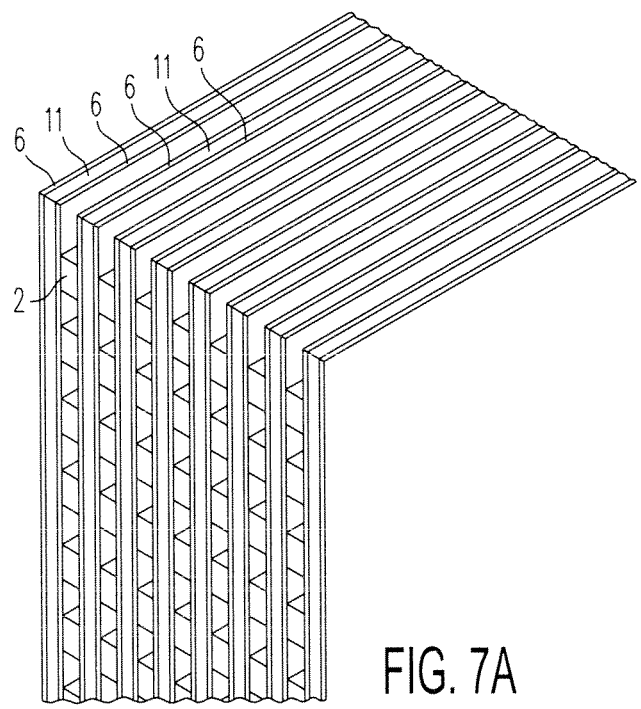
FIGS. 7A and 7B illustrate formation of the charge storage layers 6 and the gate structures (e.g., gate structures 10a and 10b).
Figure 7B:
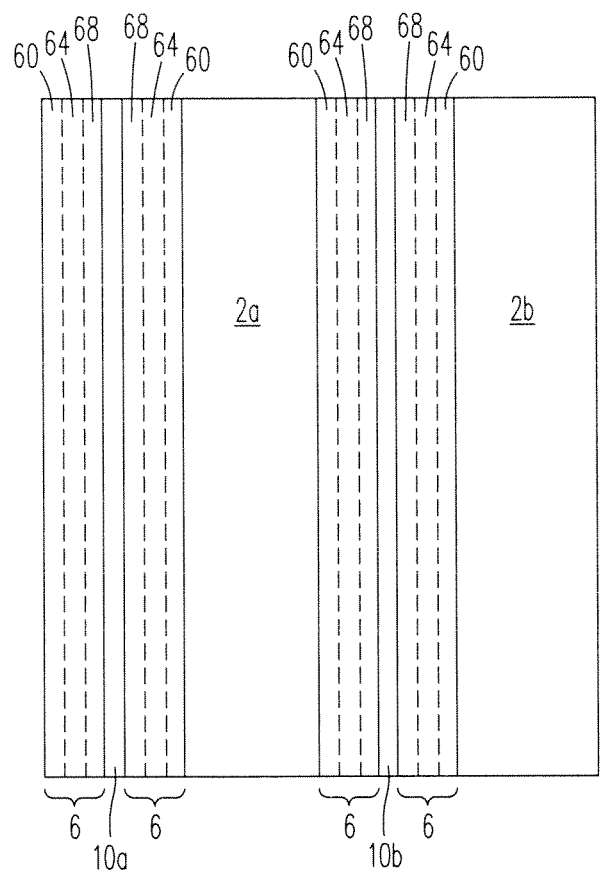

FIGS. 7A and 7B illustrate formation of charge storage layers 6 and the gate structures. FIG. 7A is an isometric view of a lesser resolution, and FIG. 7B is a more detailed top down view. As shown in FIG. 7B, each of charge storage layers 6 includes three sublayers: charge transit sublayer 60, charge trapping sublayer 64, and insulating sublayer 68. Charge transit sublayer 60 is in contact with the channel structures (e.g., channel structure 2a and 2b), and may include any suitable dielectric material (e.g., silicon oxide), and may have a thickness between 5 and 200 angstroms, most preferably about 30 angstroms. Charge transit sublayer 60 may be deposited by any suitable method, most preferably by CVD. In an alternative embodiment, charge transit sublayer 60 is thermally grown on the channel structures (e.g., channel structure 2a) by reacting an oxygen-containing gas species (e.g., oxygen) at an elevated temperature, such as 800° C. with the channel structure to forming silicon oxide. Charge transit sublayer 60 is preferred thermally grown than a deposited. By depositing or growing charge transit sublayer 60 onto the channel structures, charge transit sublayer 60 and the adjacent channel structure are coupled.

After charge transit sublayer 60 is grown or deposited, charge trapping sublayer 64 is deposited. Charge transit sublayer 60 is in contact or coupled with charge trapping sublayer 64. Charge trapping sublayer 64 may include a material selected from the following group: silicon nitride, silicon oxide nitride, hafnium oxide, aluminum oxide, titanium nitride, nanocrystalline silicon, polycrystalline silicon, nanocrystalline germanium, nanocrystalline silicon germanium, nanocrystalline tungsten, nanocrystalline gold, nanocrystalline silver, and nanocrystalline platinum. Charge trapping sublayer 64 is most preferably silicon nitride. Charge trapping sublayer 64 may be deposited by any suitable method, most preferably CVD. An example of a suitable CVD process uses dichlorosilane and ammonia as precursors at a temperature of 800° C. and pressure of 400 mTorr to deposit silicon nitride. Charge trapping sublayer 64 may be any thickness between 5 and 500 angstroms, most preferably about 90 angstroms.

After charge trapping sublayer 64 is deposited, insulating sublayer 68 is deposited. Insulating sublayer 68 may be any suitable material, and may include silicon oxide or silicon nitride, most preferably silicon oxide and may have a thickness between 5 and 1,000 angstroms, most preferably about 50 angstroms. Insulating sublayer 68 is in contact, or coupled with charge trapping sublayer 64.

Gate material layers 11 are next deposited. Gate material layers 11 may be deposited by any suitable method, most preferably a CVD process. Gate material layers 11 include a material selected from the following group: titanium nitride, tungsten, tungsten nitride, titanium, aluminum, and tantalum nitride, most preferably titanium nitride. Gate material layer 11 may be between 100 and 10,000 angstroms thick, most preferably about 200 angstroms. An exemplary process for depositing titanium nitride by CVD uses tetrakis dimethylamido titanium and ammonia precursors at a temperature of 400° C. and pressure of 250 mTorr. By depositing the gate material layer 11 directly on the insulating sublayer 68, each of gate material layers 11 and their adjacent insulating sublayer 68 are coupled.

Figure 8:
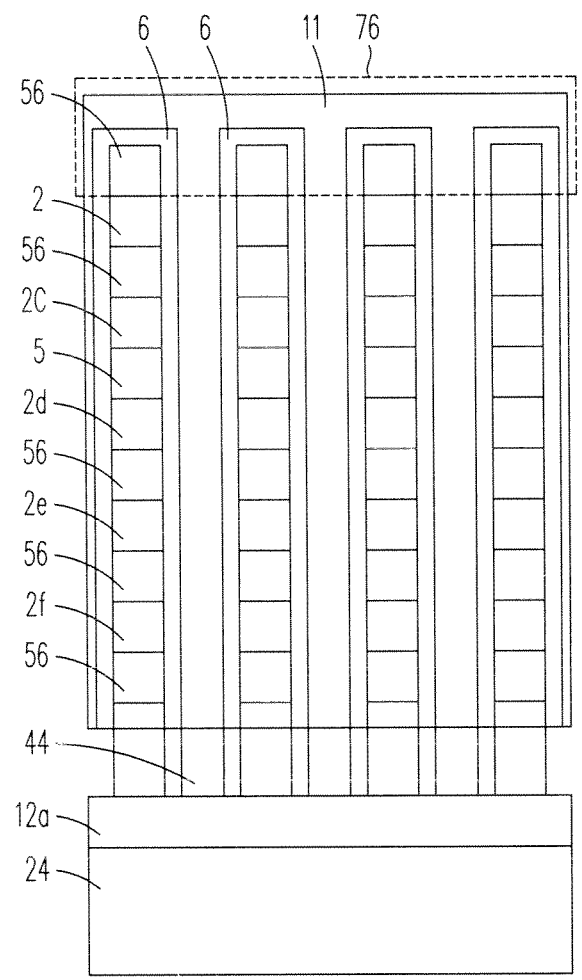
FIG. 8 shows in cross section charge storage layers 6 and gate material layers 11 as deposited, before section 76 is removed and before etch.

The portions of gate material layers 11 and charge storage layers 6 indicated by 76 in FIG. 8 are next removed, leaving the remaining portions of gate material layers and charge storage layers 6 between the channel structures. Section 76 may be removed by a CMP step, or by patterning and etch. FIG. 8 shows in cross section charge storage layers 6 and gate material layers 11 as deposited, before section 76 is removed and before etch.

Figure 9:
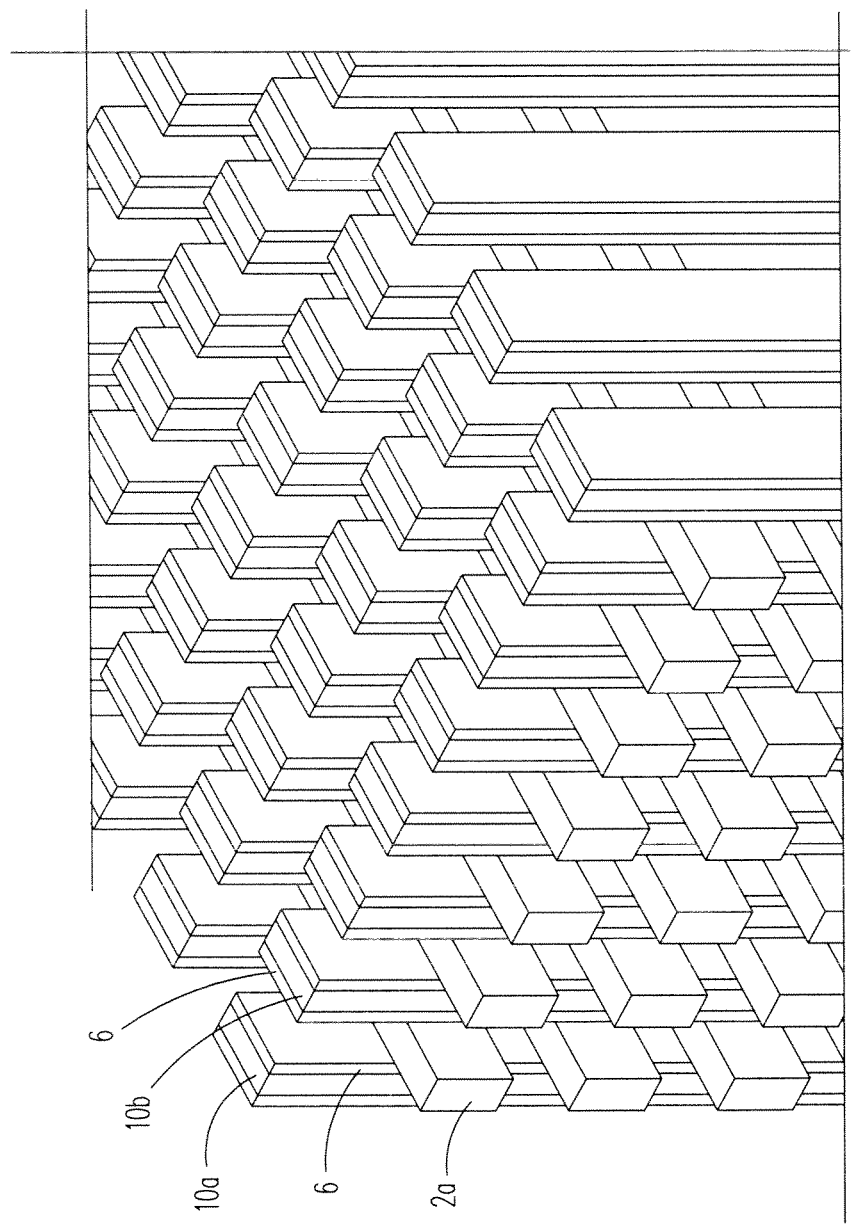
FIG. 9 illustrates etching gate material layers 11 and charge storage layers 6 after patterning and etching to form gate structures (e.g., gate structures 10a and 10b).
Figure 10:
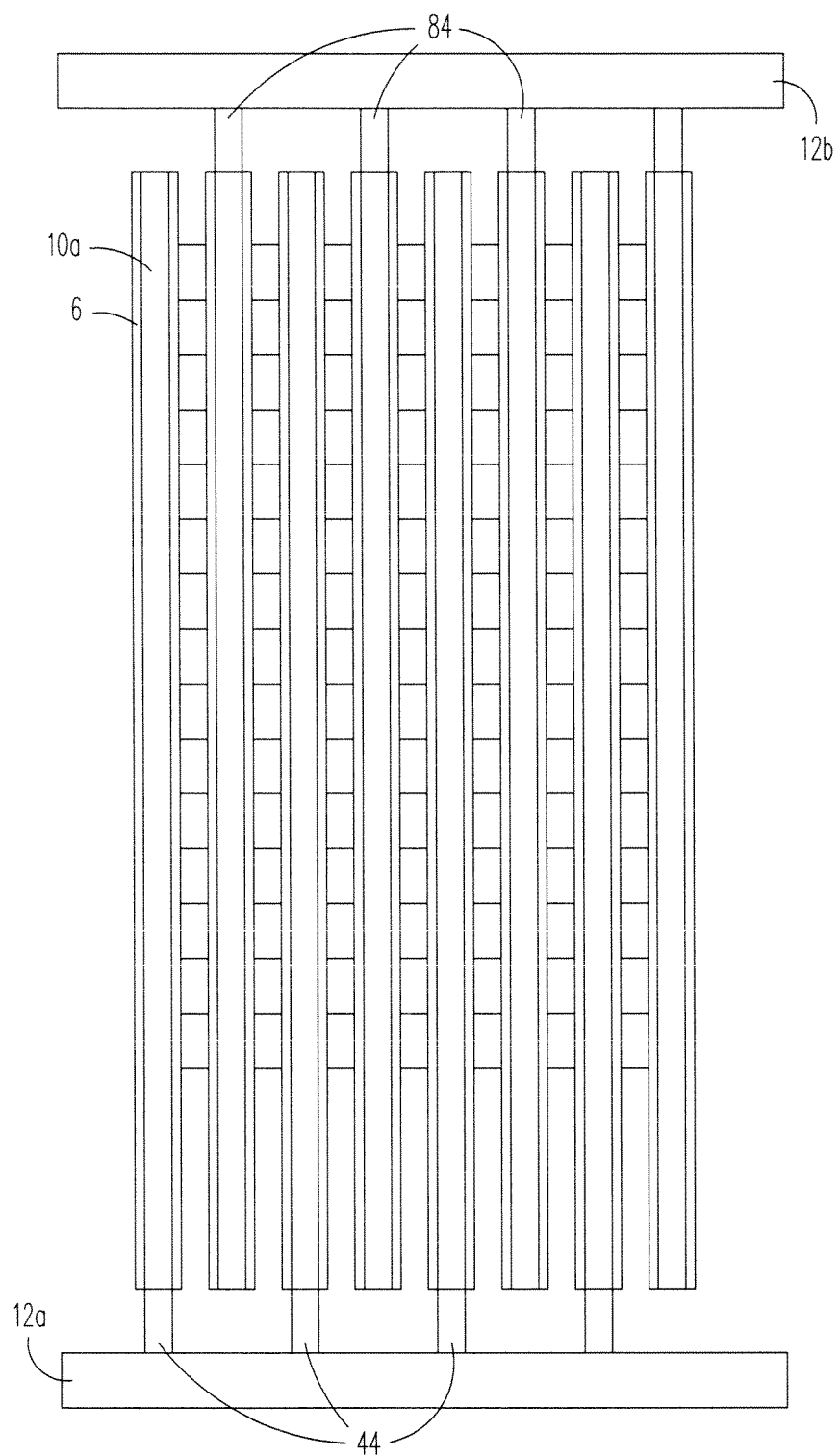
FIG. 10 shows that the gate structures on one side of each channel structure are coupled with bottom word lines 20 underneath through metal-filled vias 44.

Gate material layers 11 and charge storage layers 6 are patterned and etched to form gate structures, as shown in FIG. 9. This etch step results in vertical columns that include charge storage layers 6 on gate structures, with the gate structures being on opposing sides of each channel structure (e.g., gate structures 10a and 10b being on opposite sides of channel structure 2a). The gate structures on one side of each channel structure are coupled with bottom word lines 20 underneath through metal-filled vias 44, as shown in FIG. 10.

Figure 11:
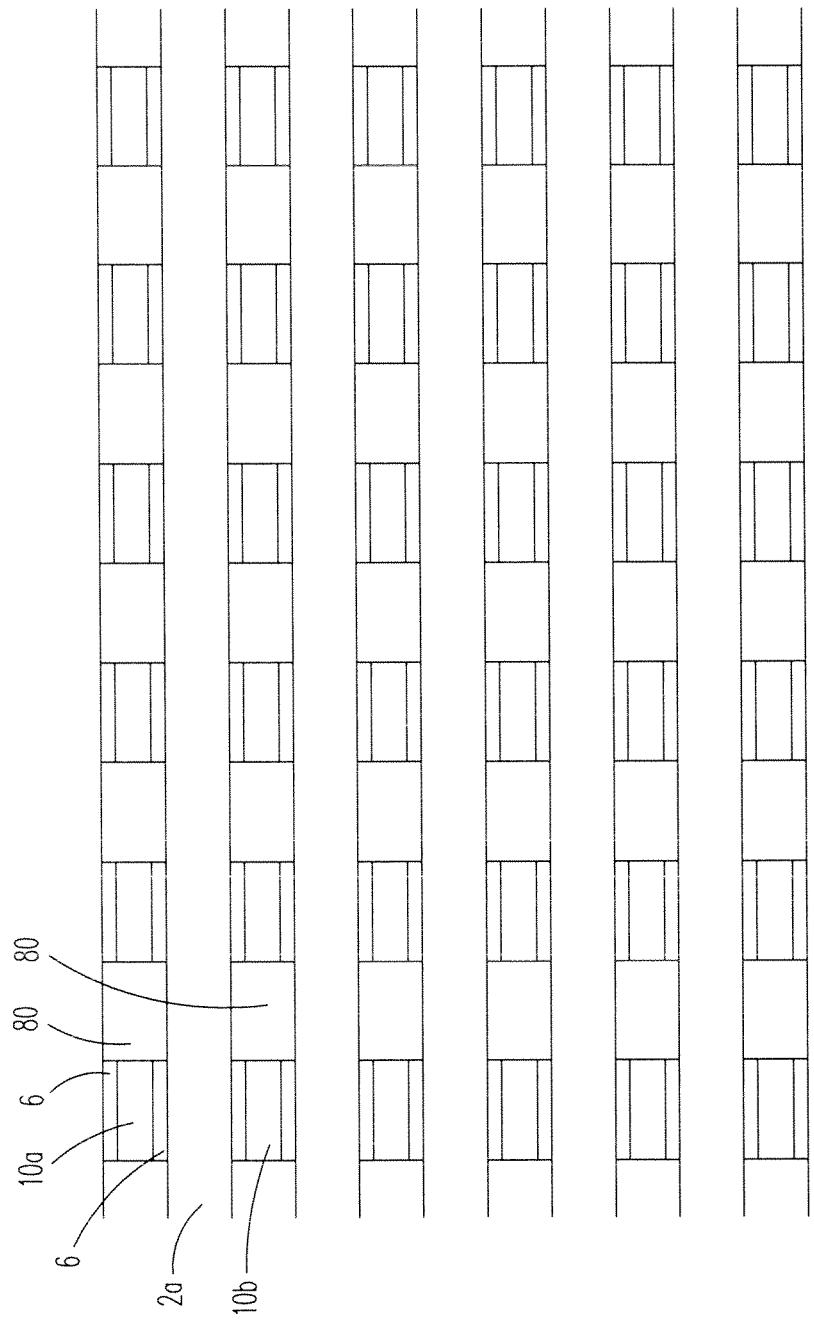
Figure 12:
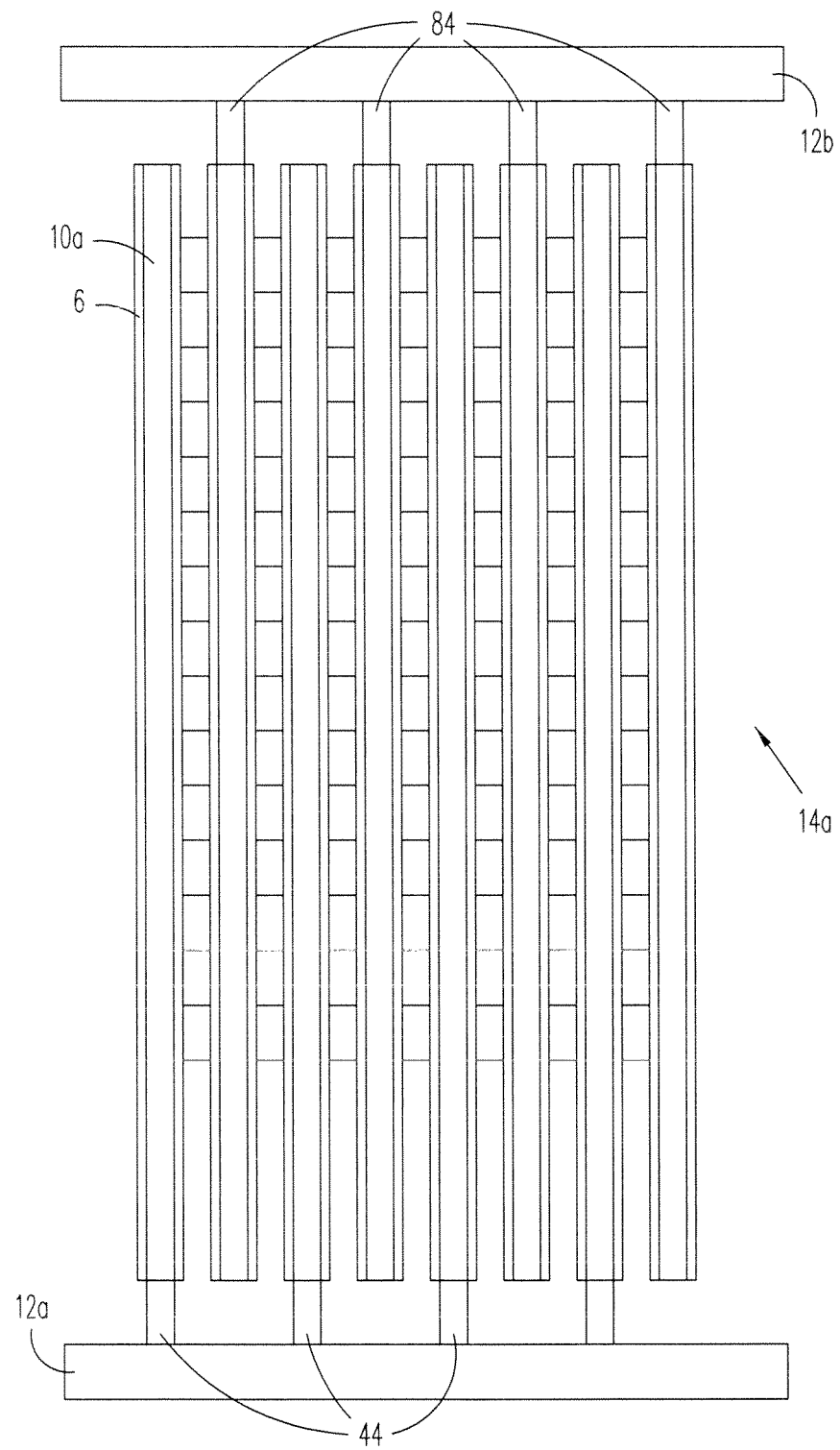
FIG. 12 is a cross sectional view of completed memory array 14a with aligned gates and charge storage layers on substantially opposing sides of the channels.

FIG. 11 shows dielectric layer 80 filling the gaps etched in between the vertical gate structures and covering the top of memory array 14a. Dielectric layer 80 may be planarized by an etchback process or by a CMP process, most preferably by CMP. Metal-filled vias 84 are fabricated by a similar process as described earlier for metal-filled via 44, and top word lines 16 (e.g., word line 12b) are fabricated by processes similar to those used to fabricate the bottom word lines 20, as shown in FIG. 12. In this embodiment, each of metal-filled vias 84 connects to a gate structure on one side of each channel structure, specifically to the gate structure that is not connected to one of metal-filled vias 44 underneath. In this manner the gate structures alternately connect to top word lines 16 and bottom word lines 20.

Memory array 14a is now substantially complete. Compared to other 3-D memory NAND circuits, memory 14a attains a substantially higher memory density. In memory array 14a of FIG. 1, charge storage layers are providing on opposing sides of each channel structure, and each charge storage layer is substantially opposite (i.e., aligned to) another charge storage layer on the opposite side of the common channel structure.

Ground conductors may be coupled to each channel structure. The ground conductors may couple to the channel structures in one of two architectures, shown respectively in FIGS. 13 and 14. The ground conductors serve to uniquely identify each memory cell in memory array 14. At least a portion 94 of each channel structure (e.g., channel structure 2j) that is in contact with the ground conductor (e.g., via 92 of FIG. 13 or horizontal ground conductor 96 of FIG. 14) is doped to a concentration greater than $10^{18}/cm^3$ dopant atoms in order to make an ohmic contact with the associated ground conductor. This heavily doped portion 94 of the channel structure can be accomplished by masking and ion implanting dopant atoms into the selected portion 94 of the channel structure. A subsequent anneal activates the dopants in the implanted channel portion.

Figure 13:
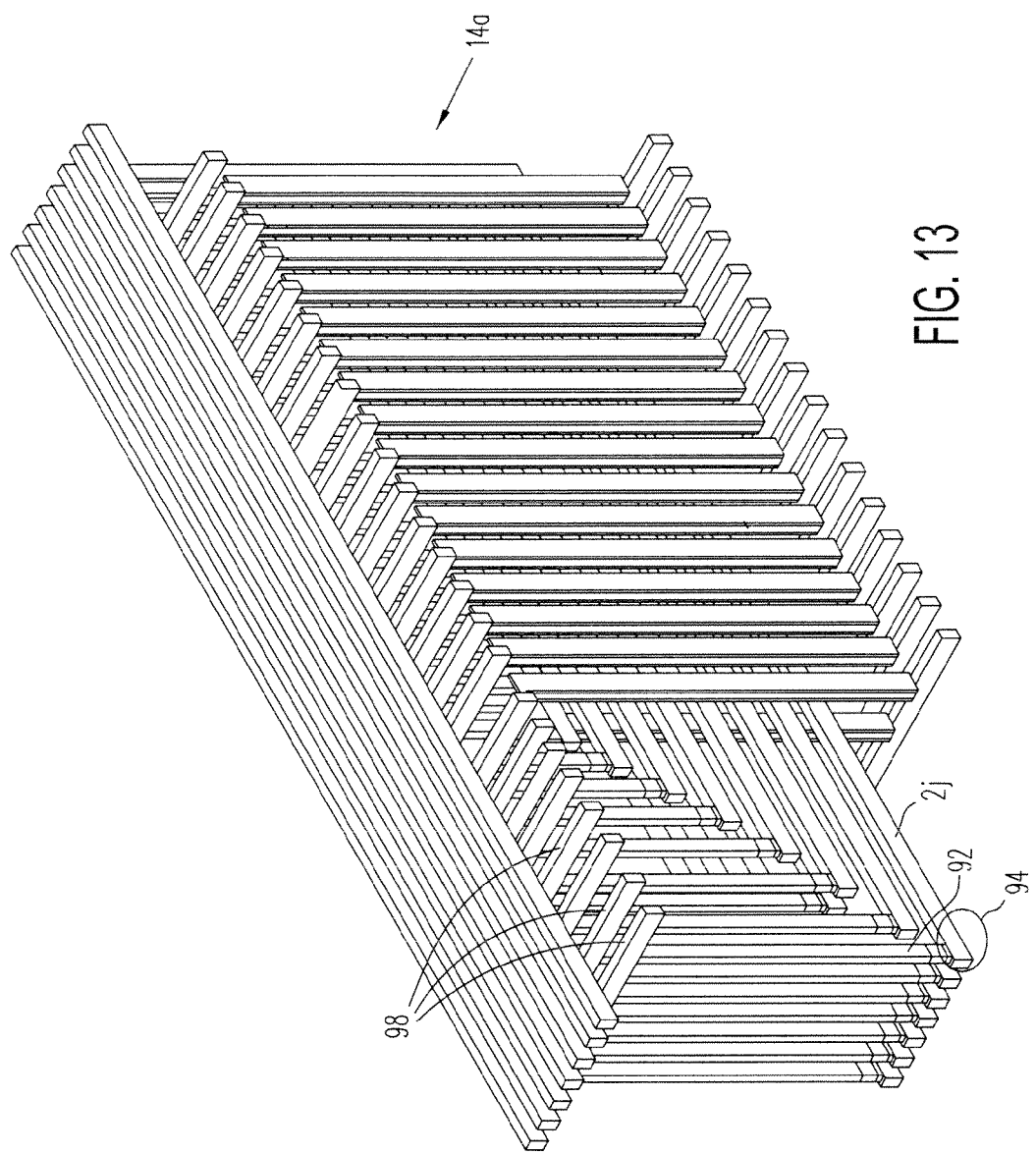
FIG. 13 shows, in a first architecture, ground conductors coupling the channels structure by vias.
Figure 14:
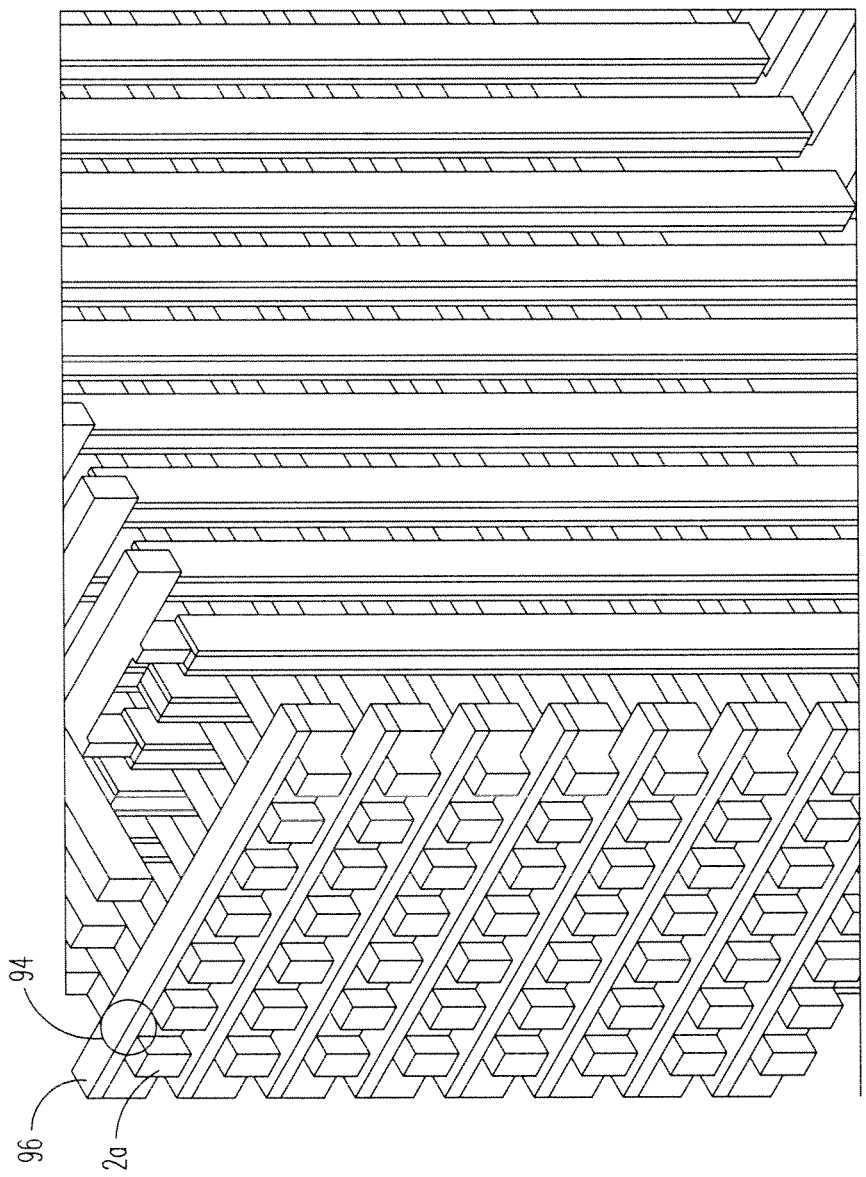
FIG. 14 shows, in a second architecture, ground conductors coupling the channels structure by horizontal conductors (e.g., horizontal conductor 96).

In the architecture shown in FIG. 13, ground conductor 98 may be connected by metal-filled via (e.g., via 92) that contacts end 94 of the channel structure. Metal-filled vias (e.g., metal-filled via 92) may formed by patterning and etching vias in dielectric layers 56 above the channel structures of the intended plane. After via mask removal, the etched vias are filled with a conductive material. This conductive material may be removed from the top of the surface of the dielectric above the vias by an etchback process or by CMP. The metal filling via 92 may include a material selected from the following group: titanium nitride, tungsten, tungsten nitride, titanium, aluminum, and tantalum nitride, most preferably a stack of titanium, titanium nitride, and tungsten. The selected metal may be deposited by any suitable method, most preferably by CVD. In the architecture shown in FIG. 14, ground conductor 96 may be a wire in a plane directly above the channel structure it is in contact with. The metal-filled via approach of FIG. 13 takes up more lateral area (i.e., area as viewed top down) than the approach of FIG. 14, but incurs fewer processing steps. The preferred approach is the one that results in the lower total cost.

Figure 15:
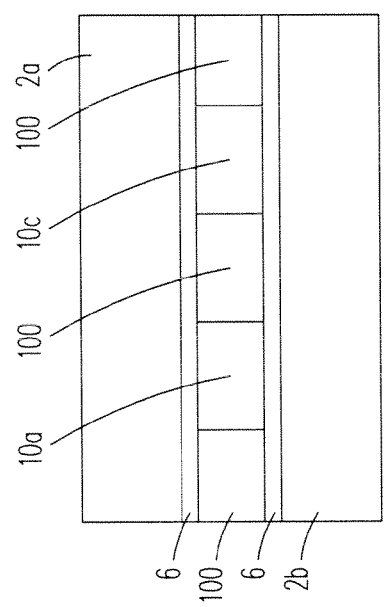
FIG. 15 shows in a top-down view dielectric material between gate structures (e.g., dielectric layer 80 of FIG. 11) replaced by gate enhancement layers 100.

Alternatively, the dielectric material between the gate structures (e.g., dielectric layers 80 of FIG. 11) may be replaced by gate enhancement layers 100, such as shown in FIG. 15. Gate enhancement layers 100 decrease the resistance in the channel between two adjacent gate structures (e.g., gate structures 10a and 10c) on one side of a channel structure, which increases the current in the channel during a read operation. Gate enhancement layers 100 are each coupled to both one of charge storage layers 6 and adjacent gate structures (e.g., gate structures 10a and 10c). Gate enhancement layers 100 may include a material selected from the following group: polycrystalline silicon, polycrystalline silicon germanium. The polycrystalline silicon or silicon germanium is heavily doped n- or p-type.

Figure 16:
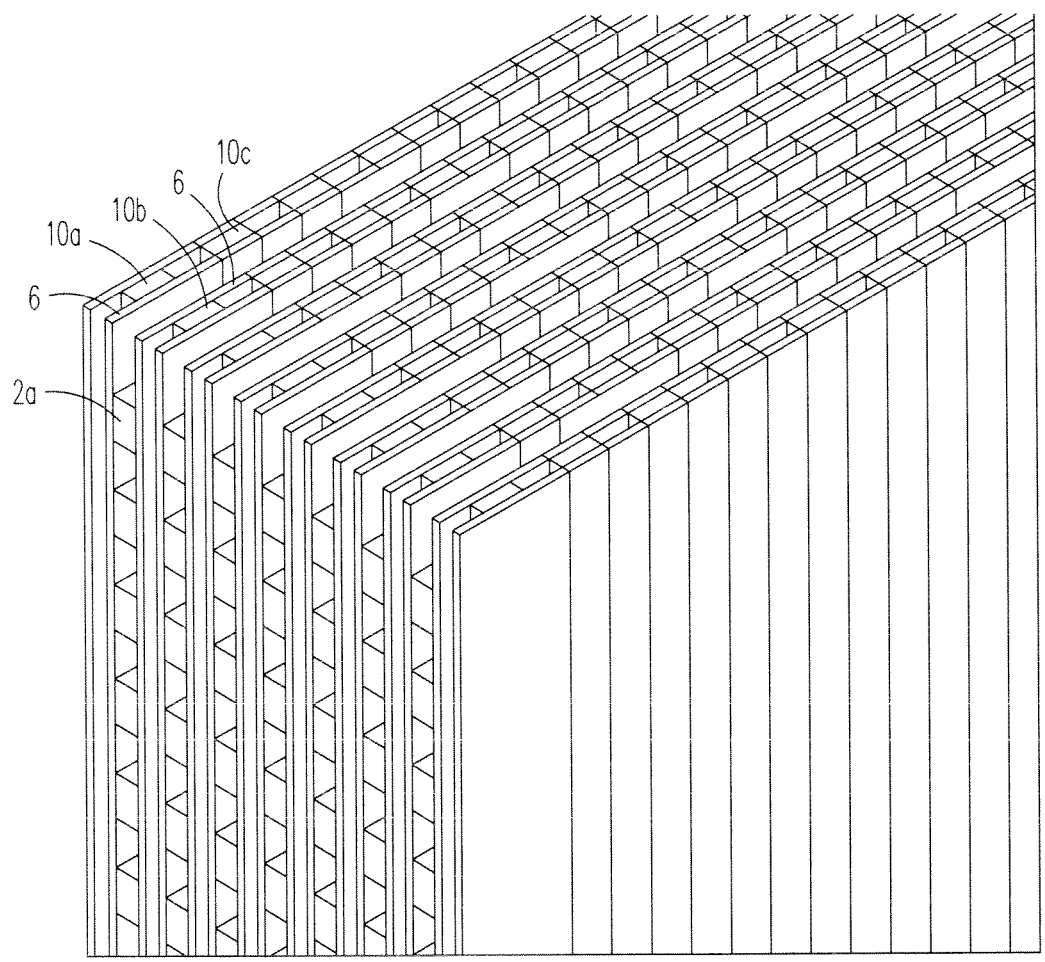
FIG. 16 is an isometric view showing that only gate material layers 11 are patterned and etched into gate structures (e.g., gate structure 10), leaving charge storage layers 6 intact.
Figure 17:
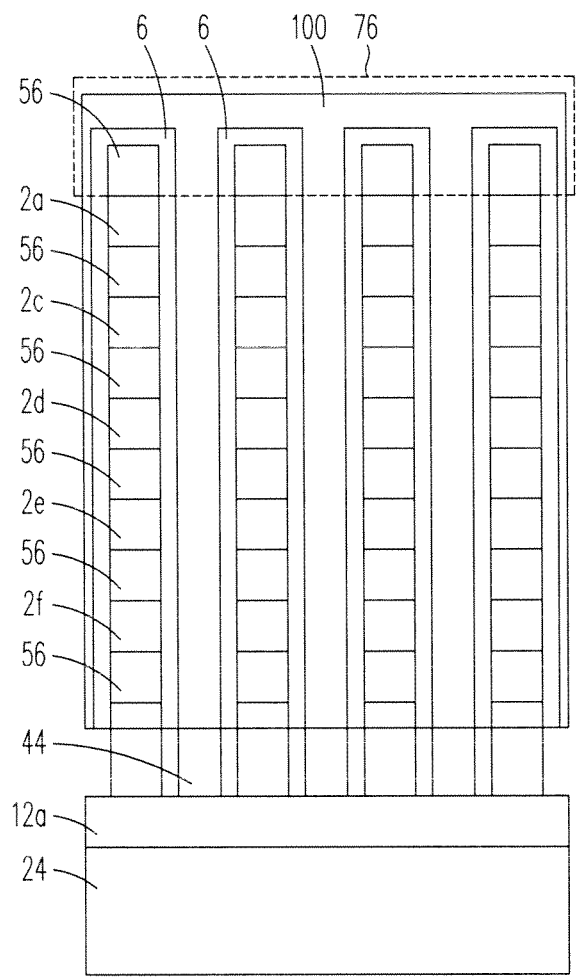
FIG. 17 is a cross sectional view showing memory array 14a after deposition of gate enhancement layers 100.
Figure 18:
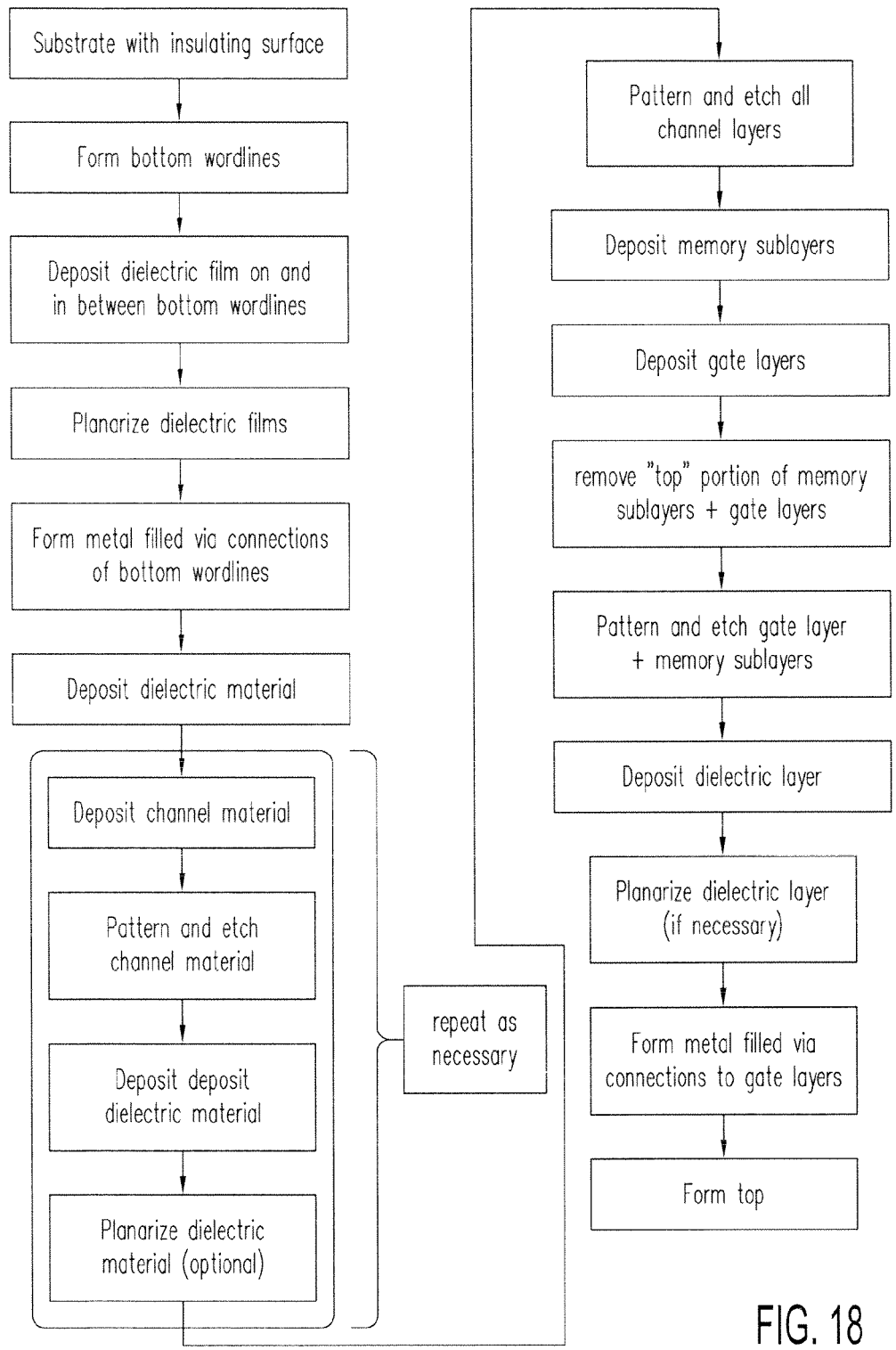
FIG. 18 is a flow chart summarizing the fabrication steps for making memory array 14a, without gate enhancement layers 100, as taught in FIGS. 1-15.
Figure 19:
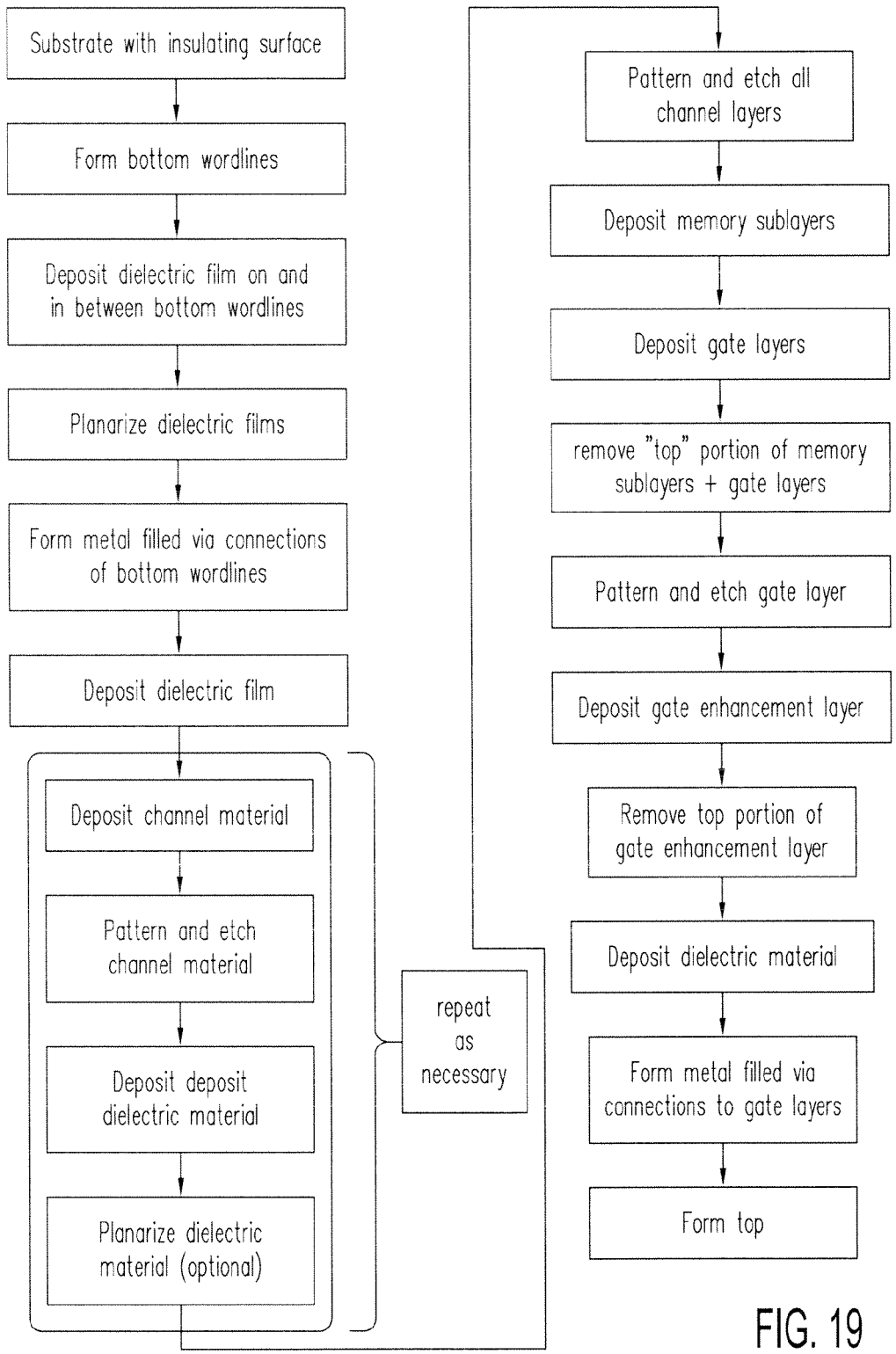
FIG. 19 is a flow chart summarizing the fabrication steps for making memory array 14a, with gate enhancement layers 100, as taught in FIG. 16.

The addition of gate enhancement layers 100 requires a different set of fabrication steps. Where gate enhancement layers 100 are used, gate material layers 11 are preferably doped polysilicon or doped polysilicon germanium. After charge storage layers 6 and gate material layers 11 are deposited, and the section indicated by 76 (FIG. 8) is removed, only gate material layers 11 are patterned and etched to form gate structures (e.g., gate structures 10a and 10c), leaving charge storage layers 6 intact, as shown in FIG. 16. Rather than filling the gaps in between the gate structures by a dielectric material, the gaps are deposited with doped polysilicon or doped polysilicon germanium. FIG. 17 is a cross sectional view showing memory array 14a after deposition of gate enhancement layers 100. If gate material layers 11 are doped n-type, gate enhancement layers 100 are doped p-type. If the gate material layers 11 are doped p-type, gate enhancement layers 100 are doped n-type. The remaining fabrication steps for an embodiment with gate enhancement layers 100 are similar to those steps already discussed above for the embodiment without gate enhancement layers 100. FIGS. 18 and 19 are flow charts summarizing the fabrication steps for making memory array 14a, without and with gate enhancement layers 100, as taught in FIGS. 1-15 and FIG. 16, respectively.

Figure 20:
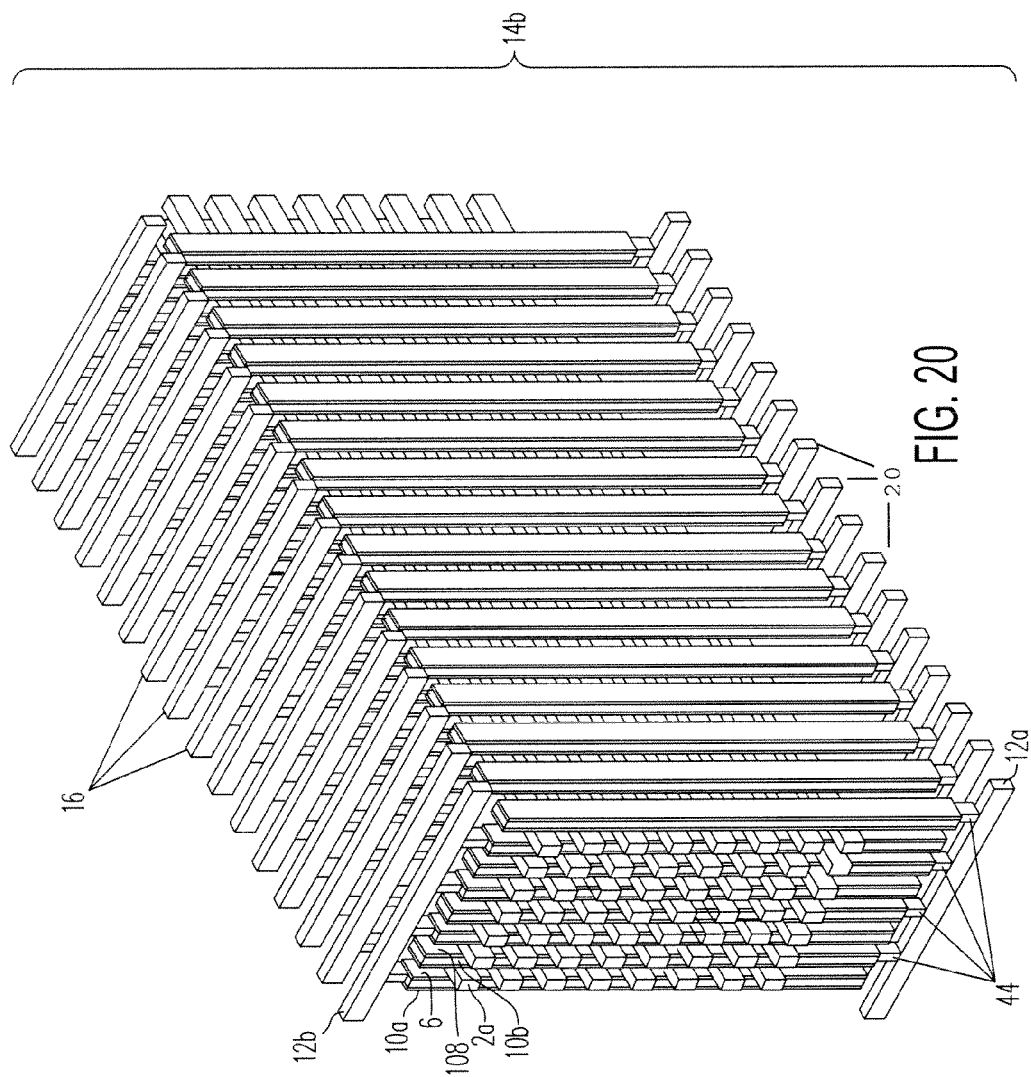
FIG. 20 is an isometric view of memory array 14b in which charge storage layers 6 and the gate structures (e.g., gate structure 10a) are arranged on one side of each channel structure or NAND string, and a second independently controlled gate structure (e.g., gate structure 10b), separated from the associated channel structure (e.g., channel structure 2) by a dielectric layer 108, is arranged opposite charge storage layers 6.

FIG. 20 is an isometric view of memory array 14b in which charge storage layers 6 and a first set of gate structures are arranged on one side of each channel structure or NAND string (e.g., gate structure 10a and charge storage layer 6 are provided on one side of channel structure 2a), and a second set of independently controlled gate structures, separated from the associated channel structure by a dielectric layer 108 (e.g., gate structure 10b separated from channel structure 2a by dielectric 108), is arranged opposite charge storage layers 6. In this manner, each memory cell may have two gate structures actively controlling it (i.e., one gate structure controls the memory cell for programming, read and erase, while the other gate structure controls if for conduction, when not selected for programming, read and erase). As shown in FIG. 20, there are 16 memory cells per channel structure, or one half the memory cells in the example of FIG. 1. There could be fewer or more memory cells per channel layer, for example, a total of 4, 64, or 1024 memory cells per channel structure. There are dielectric films (e.g., silicon oxide) in between the individual channel structures and between charge storage layers 6 and the individual gate structures, though it is not distinct in FIG. 20.

The gate structures (e.g., gate structure 10a) on one side of each channel structure (e.g., channel structure 2) are connected to bottom word lines 20 underneath. The other gate structures (e.g., gate structure 10b) are connected to top word lines 16 above the channel structures. Of course, this connection arrangement can also be reversed. The detailed fabrication steps and further details of the elements of the memory are now discussed.

Although not shown in FIG. 20, other devices may exist below, above, or on either side of memory array 14b. These other devices may be transistors, capacitors, resistors, or any other suitable devices and circuits, including support circuitry such as sense amplifiers, address decoders, registers and other circuits known in the art to be associated with memory circuits.

Figure 21:
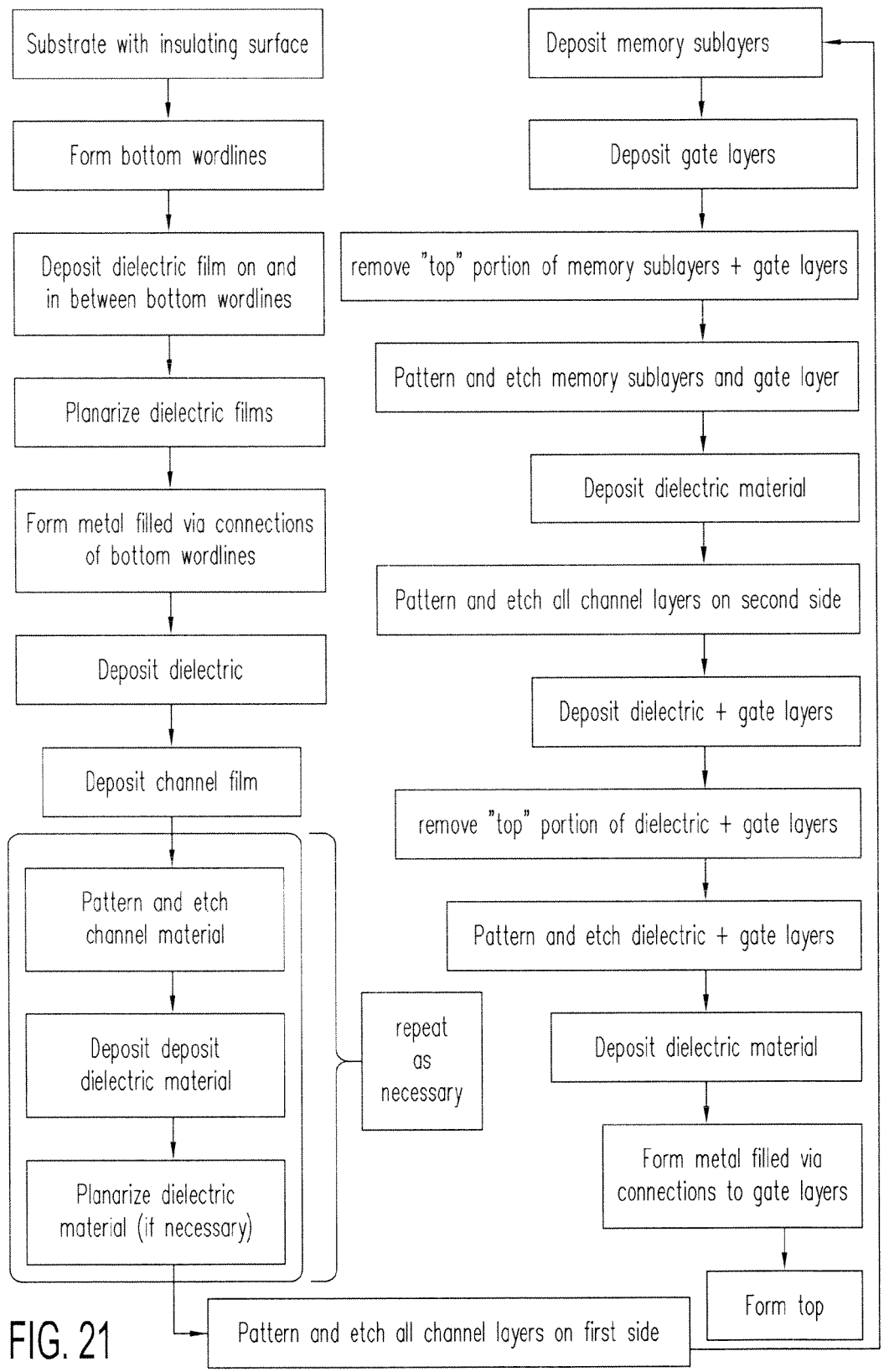
FIG. 21 shows in a flow chart the fabrication steps of memory array 14b of FIG. 20.
Figure 22:
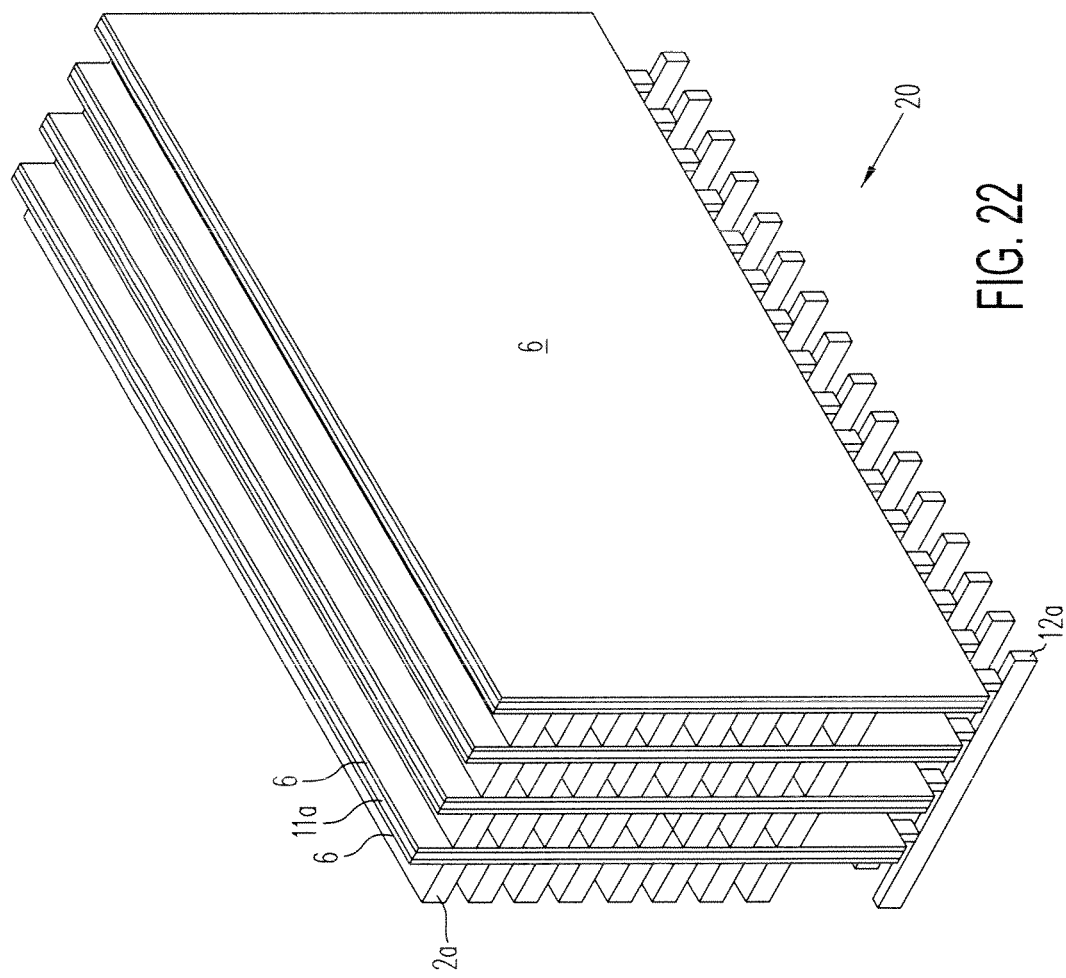
FIG. 22 shows an isometric view, for memory array 14b of FIG. 20, the charge storage layers 6 and first set 11a of gate material layers couple to the channel structures on only one side.

The fabrication steps of memory array 14b are summarized by the flow chart in FIG. 21. The steps through formation of charge storage layers 6 and first set 11a of gate material layers are similar to those discussed above with respect to memory array 14 of FIG. 1, except that the charge storage layers 6 and first set 11a of gate material layers couple to the channel structures eventually only on one side. FIG. 22 shows the charge storage layers 6 and first set 11a of gate material layers after deposition and removal of a section from the "top" of memory array 14b in construction.

A second set of trenches are then etched through the channel structures lengthwise, i.e., substantially parallel to first set 11a of gate material layers, to provide room for second set 11b of gate material layers. Dielectric layer 108 is then deposited into these second set of trenches. Dielectric layer 108 may include a material selected from the following group: silicon oxide, silicon nitride, silicon oxide nitride, aluminum oxide, hafnium oxide, hafnium oxide silicate, and tantalum oxide, most preferably silicon oxide. Dielectric layer 108 may have a thickness of between 10 and 1,000 angstroms, most preferably 100 angstroms. Following the deposition of dielectric layer 108, second set 11b of gate material layers are deposited on the dielectric layer 108. Second set 11b of gate material layers may include a material selected from the following group: titanium nitride, tungsten, tungsten nitride, titanium, aluminum, and tantalum nitride, most preferably titanium nitride. Second set 11b of gate material layers may have a thickness of between 10 and 1,000 angstroms, most preferably 200 angstroms.

Figure 23:
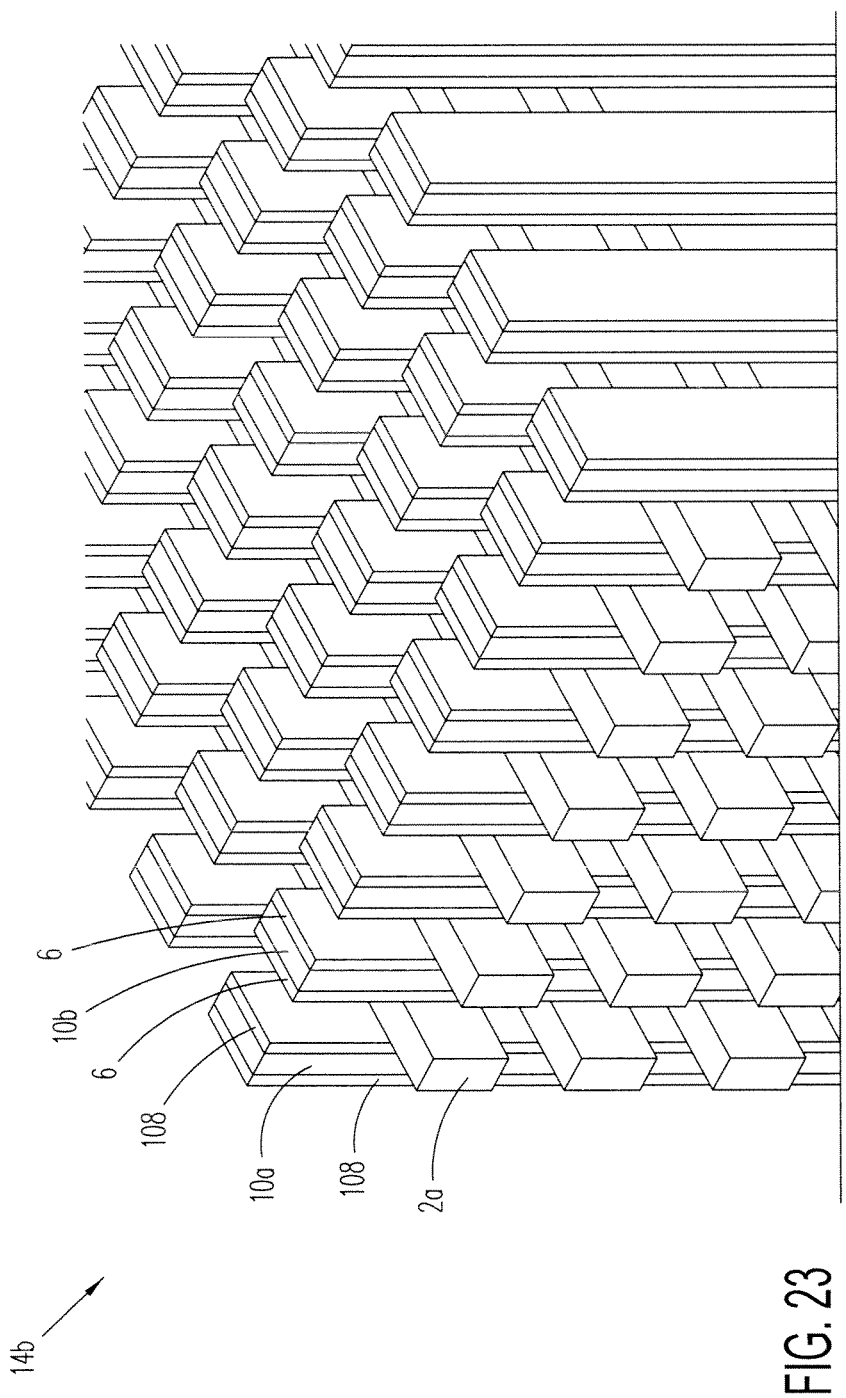
FIG. 23 shows memory array 14b after charge storage layers 6, first set 11a of gate material layers, dielectric layers 108 and second set 11b of gate material layers are patterned and etched to create gate structures (e.g., gate structures 10a and 10b).

Charge storage layers 6, first set 11a of gate material layers, dielectric layers 108 and second set 11b of gate material layers are then patterned and etched to create gate structures (e.g., gate structures 10a and 10b), as shown in FIG. 23. The gaps between the resulting gate structures created by this etching step are then filled with a dielectric material. Similar to the proves for fabricating memory array 14a of FIG. 1, top word lines 16 are formed and are connected to second set of gate structures 10b by metal-filled vias 84, as shown in FIG. 20.

Figure 24:
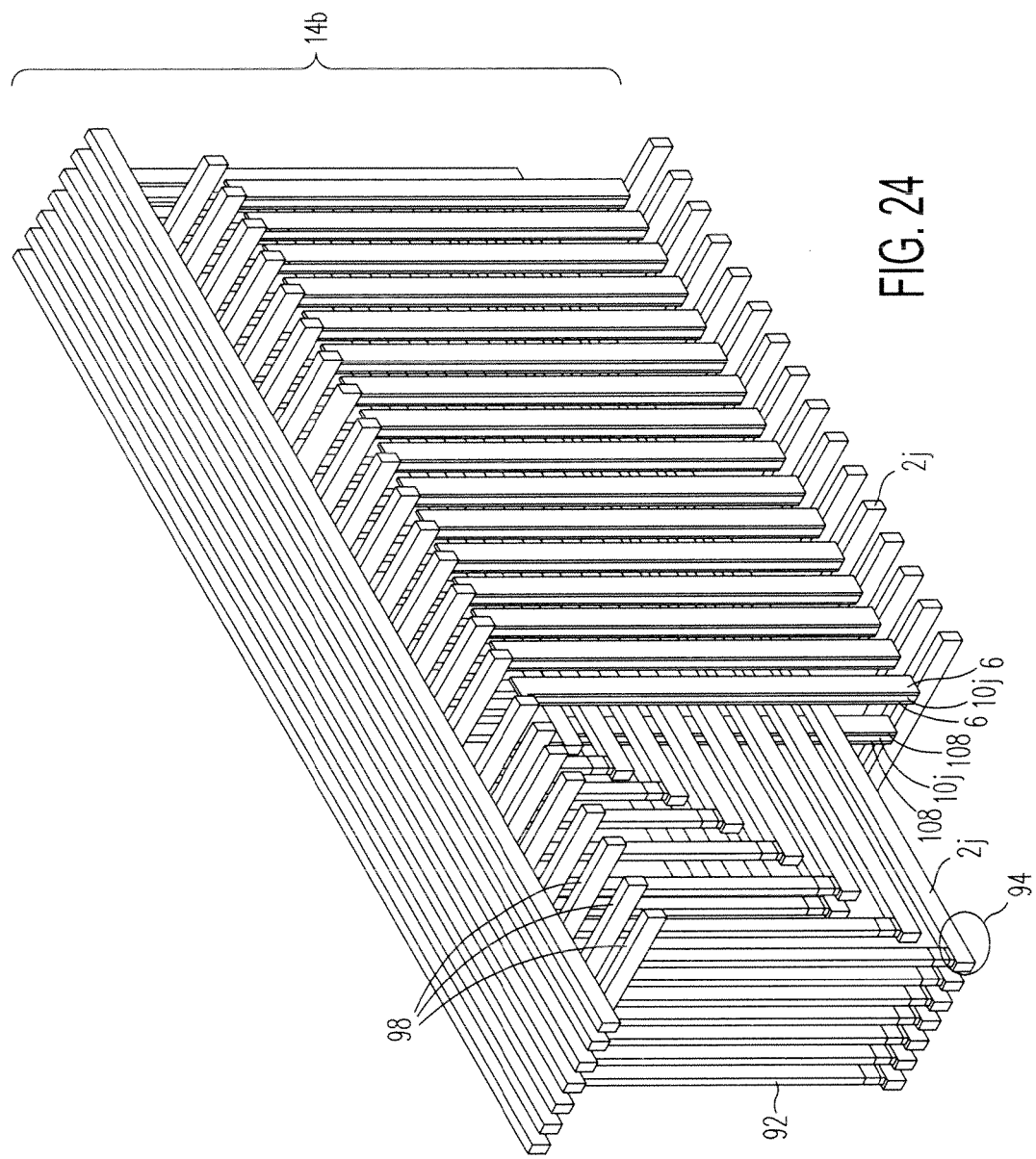
FIG. 24 is an isometric view showing, for memory array 14b of FIG. 20, one architecture for providing ground conductors through connections by vias (e.g., via 92) to horizontal conductors 98.

Ground conductors may couple to the channel structures to enable unique identification of each memory cell. Similar to memory array 14a of FIG. 1, FIG. 24 shows one architecture for providing in memory array 14b ground conductors through connections by vias (e.g., via 92) to horizontal conductors 98.

FIG. 25 shows, for memory array 14b of FIG. 20, a second architecture for providing ground conductors through connections by horizontal conductors (e.g., ground conductor 96).

Figure 26:
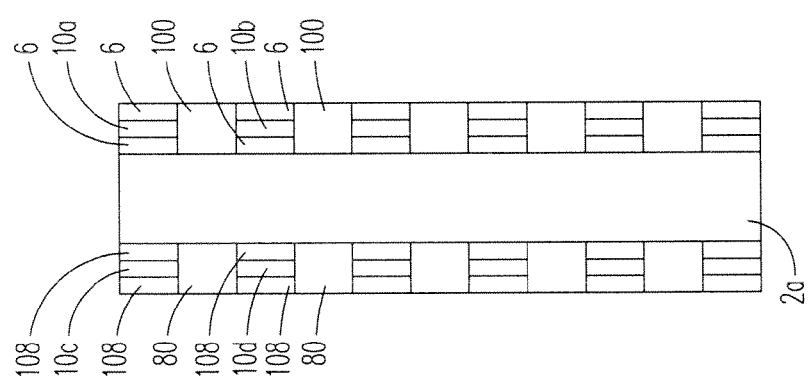
FIG. 26 is a top-down view showing, for memory array 14b of FIG. 20, gate enhancement layers 100 between the vertical gate structures.

As in memory array 14a of FIG. 1, gate enhancement layers 100 may be used to decrease the resistance in the channel structures (e.g., channel structure 2a). The gate enhancement layers 100 are shown in plan view in FIG. 26. Gate enhancement layers 100 are deposited on the side of each channel structure adjacent charge storage layers 6, and are not deposited on the side of the channel structure with dielectric layer 108 (e.g., gate structure 10c) only (no memory layers). Instead, the gaps in between the second set of gate structures are filled with dielectric material 80, as shown in FIG. 26.

Figure 27:
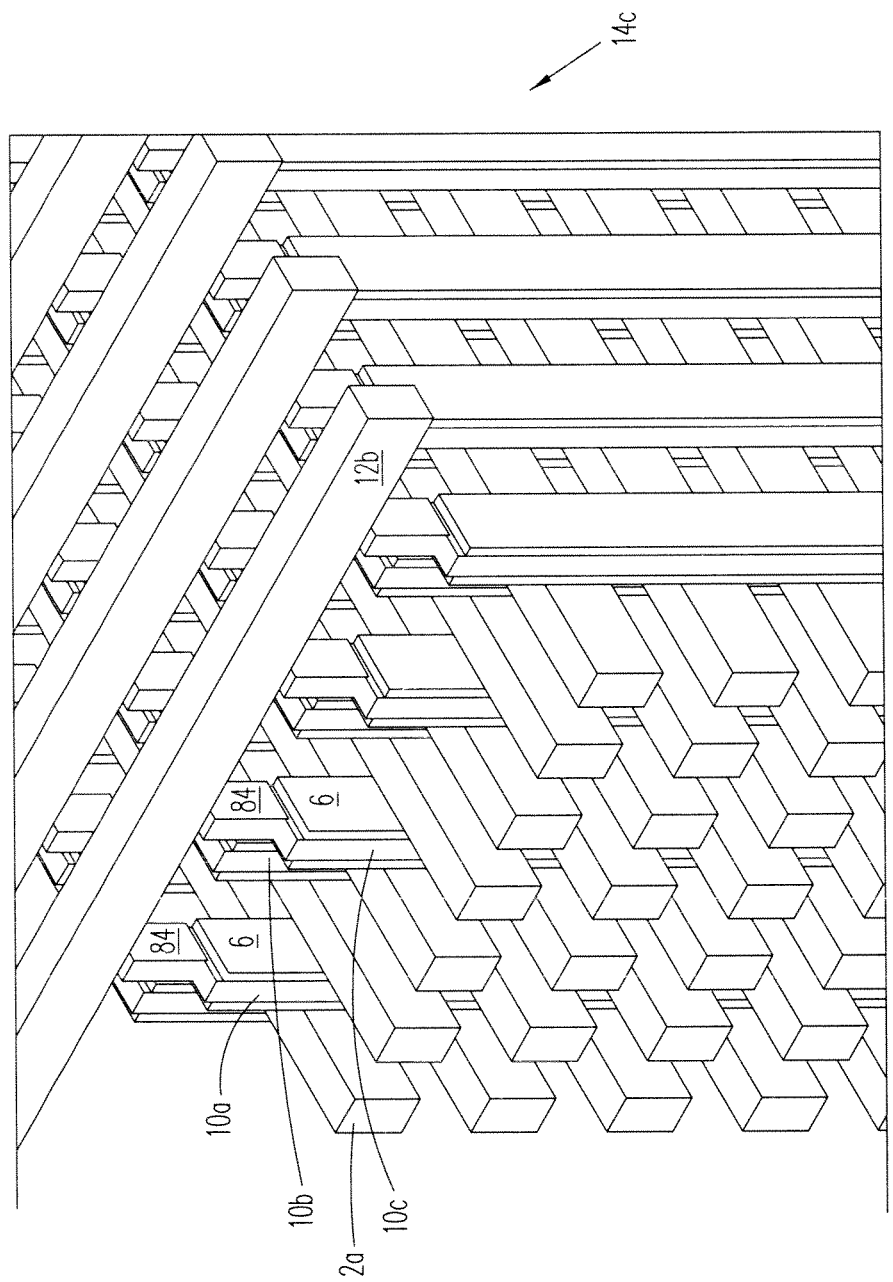
FIG. 27 shows memory array 14c in which charge storage layers 6 and the gate structures are provided on either side of each channel structure, but are not aligned on opposite sides of the channel structure, being provided in a staggered configuration.
Figure 28:
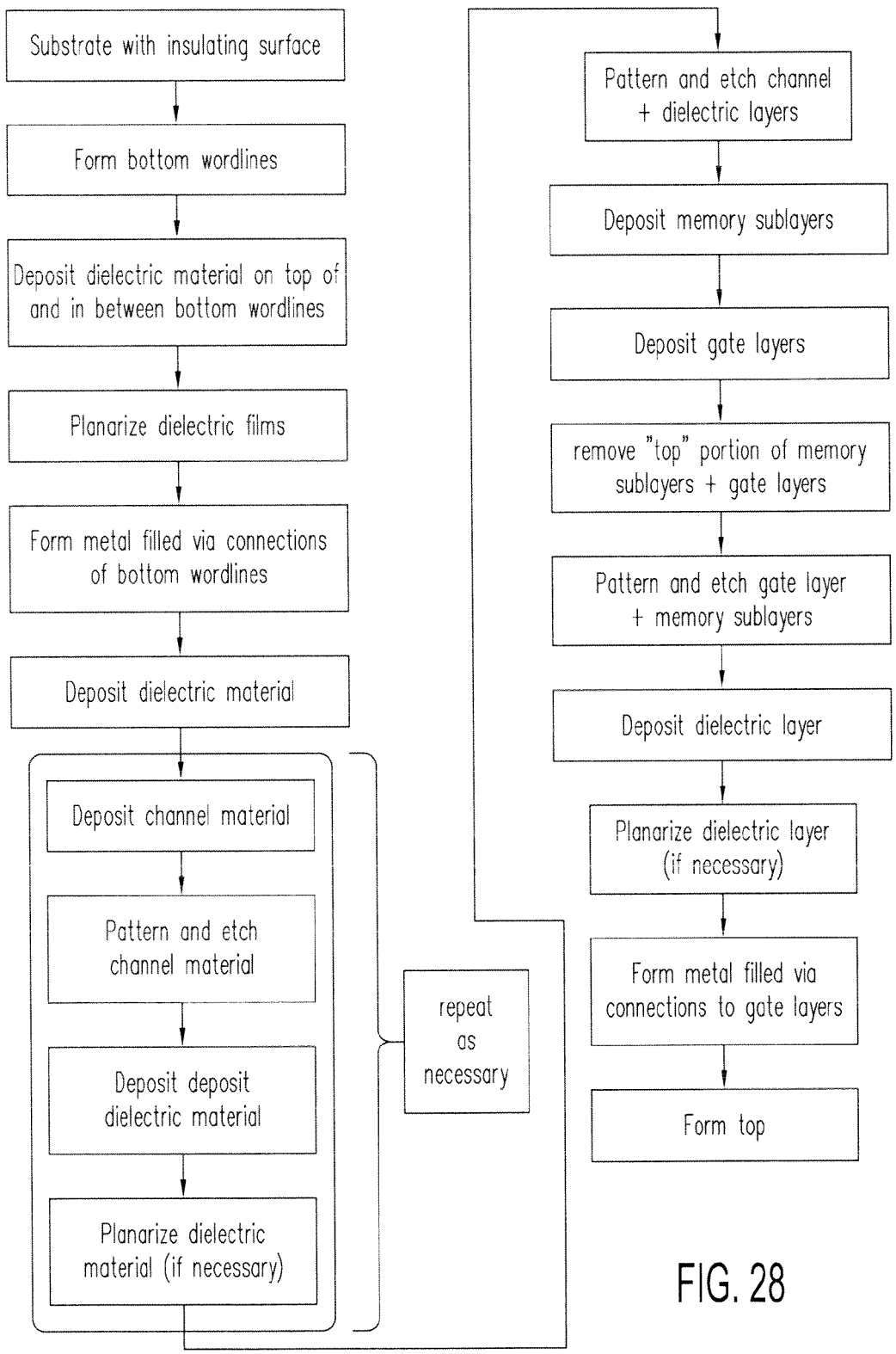
FIG. 28 is a flow chart showing a summary of the process steps for fabricating memory array 14c of FIG. 27.

FIG. 27 shows memory array 14c in which charge storage layers 6 and the gate structures are provided on either side of each channel structure, but are not aligned on opposite sides of the channel structure, being provided in a staggered configuration. Memory array 14c may be fabricated using a process similar to that described above with respect to memory array 14 of FIG. 1, except that the patterning and etching of charge storage layers 6 and gate material layers 11 leaves vertical columns on either side of a channel structure, but not aligned on opposite sides of each channel structure, being provided in a staggered configuration. A process flow summary for fabricating memory array 14c is shown in FIG. 28.

Figure 29:
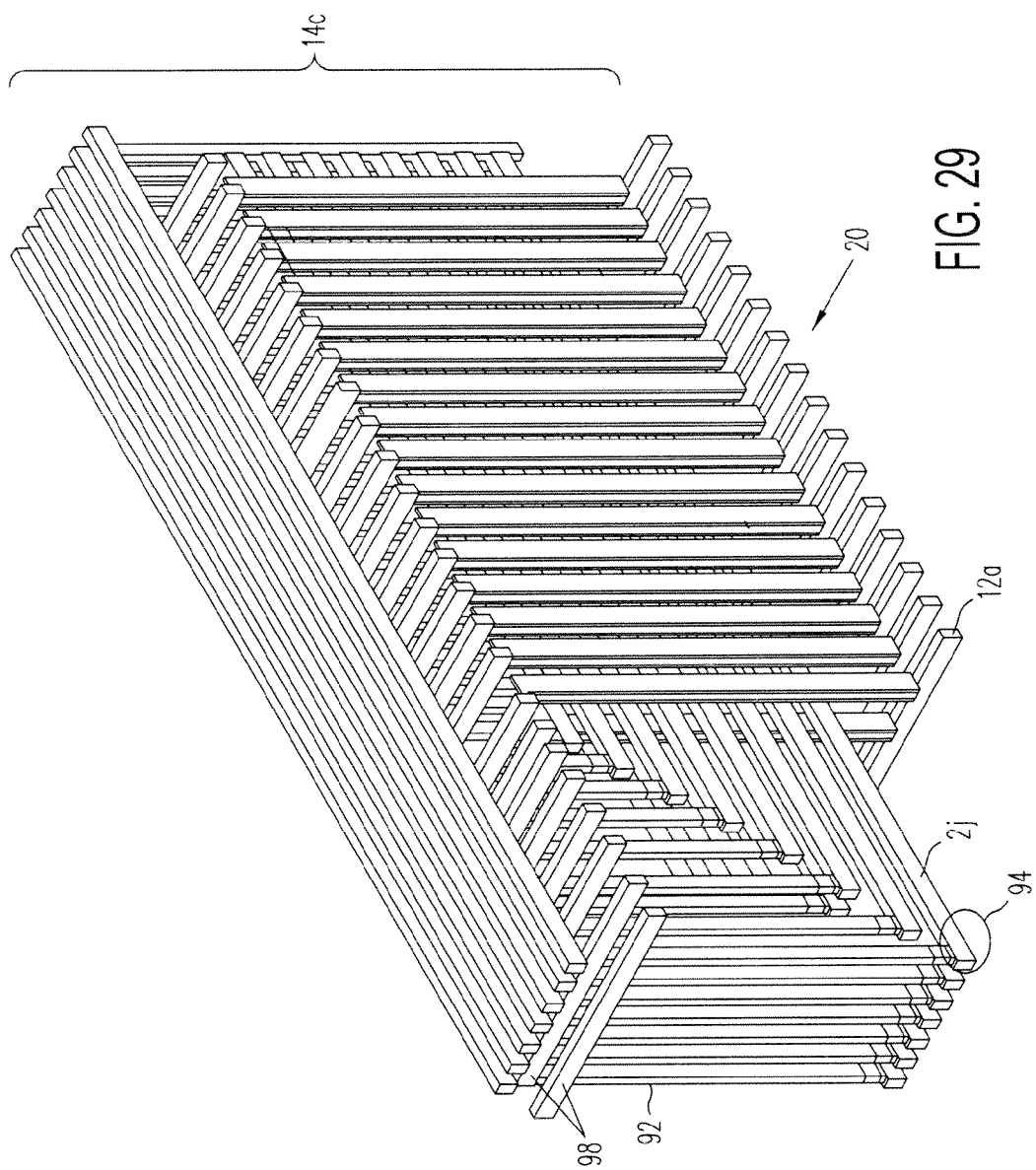
FIG. 29 is an isometric view showing, for memory array 14c of FIG. 27, one architecture for providing ground conductors through connections by vias (e.g., via 92) to horizontal conductors 98.
Figure 30:
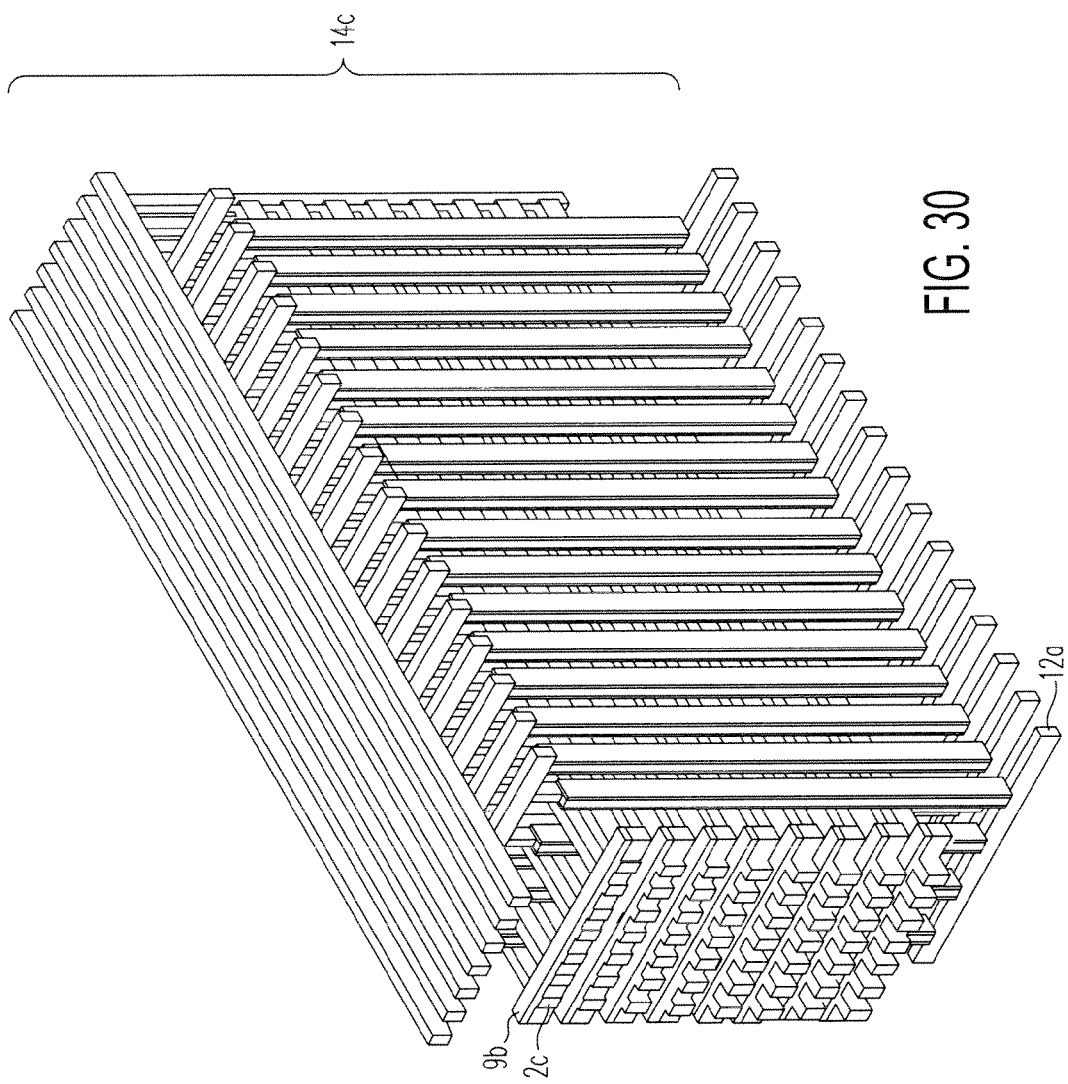
FIG. 30 shows, for memory array 14c of FIG. 27, a second architecture for providing ground conductors through connections by horizontal conductors (e.g., ground conductor 96).

As described above, ground conductors may couple to the channel structures to enable unique identification of each memory cell. FIG. 29 is an isometric view showing, for memory array 14c of FIG. 27, one architecture for providing ground conductors through connections by vias (e.g., via 92) to horizontal conductors 98. FIG. 30 shows, for memory array 14c of FIG. 27, a second architecture for providing ground conductors through connections by horizontal conductors (e.g., ground conductor 96). Gate enhancement layers may also be provided between the gate structures on either side of the channel.

This detailed description is provided to illustrate the specific embodiments of the present invention and should not be construed as limiting. Other modification and variations within the scope of the present invention are possible. These embodiments are provided so that the disclosure is thorough and complete, and fully conveying the scope of the invention to those skilled in the art. The present invention is set forth in the following claims.

I claim:

1. A memory array provided on a semiconductor substrate, comprising:
    a plurality of channel structures arranged in multiple layers above a surface of the semiconductor substrate, each channel structure extending along a first direction substantially parallel a surface of the semiconductor substrate;
    a first plurality of gate structures each extending along a second direction substantially transverse to the first direction and substantially perpendicular to the surface of the semiconductor substrate, each gate structure being adjacent one of the channel structures, separated therefrom by a layer of memory material;
    a second plurality of gate structures, wherein the first and second pluralities of gate structures are organized such that one of the gate structures of the first plurality of gate structures and one of the gate structures of the second plurality of gate structures are provided on opposite sides of one of the channel structures, so as to form a memory cell of the memory array controlled by both the gate structures on the opposite sides of that one of the channel structures;
    and
    a first plurality of conductors provided to connect some or all of the pluralities of gate structures with circuitry fabricated in the semiconductor substrate.

2. The memory array of claim 1, wherein the channel structure comprises a material selected from the following group: polycrystalline silicon, polycrystalline silicon germanium, amorphous silicon, amorphous silicon germanium, and indium-gallium-zinc oxide.

3. The memory array of claim 2, wherein at least a portion of the channel structure has a doping concentration less than $1 \times 10^{18}/cm^3$.

4. The memory array of claim 1, wherein the memory layer comprises a charge storage layer.

5. The memory array of claim 4, wherein the charge storage layer is a composite of a charge transit layer, a charge trapping layer, and an insulating layer.

6. The memory array of claim 5, wherein the charge trapping layer comprises a material selected from the following group: silicon nitride, silicon oxide nitride, hafnium oxide, aluminum oxide, titanium nitride, nanocrystalline silicon, polycrystalline silicon, nanocrystalline germanium, nanocrystalline silicon germanium, nanocrystalline tungsten, nanocrystalline gold, nanocrystalline silver, and nanocrystalline platinum.

7. The memory array of claim 1, wherein the gate structure comprises a material selected from the following group: titanium nitride, tungsten, tungsten nitride, titanium, aluminum, tantalum nitride, polycrystalline silicon, and polycrystalline silicon germanium.

8. The memory array of claim 1, wherein the gate structures are organized such that two of the gate structures are provided on opposite sides of one of the channel structures, each separated from the channel structure by a layer of the memory material.

9. The memory array of claim 8 wherein the two gate structures are aligned along a third direction transverse to both the first and the second directions.

10. The memory array of claim 8 wherein the two gate structures are not aligned along a third direction transverse to both the first and the second directions.

11. The memory array of claim 1, wherein the conductors comprise a material selected from the following group: titanium nitride, tungsten, tungsten nitride, titanium, aluminum, tantalum nitride, polycrystalline silicon, and polycrystalline silicon germanium.

12. The memory array of claim 1, further comprising a second plurality of conductors for providing connections to the channel structures.

13. The memory array of claim 12, wherein the conductors in the second plurality of conductors comprise a material selected from the following group: titanium nitride, tungsten, tungsten nitride, titanium, aluminum, and tantalum nitride.

14. The memory array of claim 12, wherein each channel structure connected to one of the second plurality of conductors includes a portion that has a doping concentration greater than $1 \times 10^{19}/cm^3$.

15. The memory array of claim 1, wherein a plurality of memory cells sharing one of the channel structures are connected in series to form a NAND string.

16. The memory array of claim 1, further comprising a gate enhancement layer provided between adjacent gate structures, wherein the gate structures are doped a first conductivity type and wherein the gate enhancement layer is doped a second conductivity type different from the first conductivity type.

17. A memory array provided on a semiconductor substrate, comprising:
  a plurality of channel structures arranged in multiple layers above a surface of the semiconductor substrate, each channel structure extending along a first direction substantially parallel a surface of the semiconductor substrate;
  a first plurality of gate structures each extending along a second direction substantially transverse to the first direction and substantially perpendicular to the surface of the semiconductor substrate, each gate structure being adjacent one of the channel structures, separated therefrom by a layer of memory material;
  a first plurality of conductors provided to connect the gate structures with circuitry fabricated in the semiconductor substrate, wherein at each location where one of the gate structure adjacent one of the channel structures, a portion of the gate structure, a portion of the channel structure and the layer of memory material constitute a memory cell of the memory array; and
  a second plurality of gate structures, wherein the first and second pluralities of gate structures are organized such that one of the gate structures of the first plurality of gate structures and one of the gate structures of the second plurality of gate structures are provided on opposite sides of one of the channel structures, and wherein that gate structure of the second plurality of gate structures is separated from the channel structure by a layer of dielectric material, without the layer of memory material.

18. The memory array of claim 17, wherein the gate structure of the first plurality of gate structures and the gate structure of the second plurality of gate structures are aligned along a third direction transverse to both the first and the second directions.

19. The memory array of claim 17, wherein the dielectric material comprises a material selected from the following group: silicon oxide, silicon nitride, silicon oxide nitride, aluminum oxide, hafnium oxide, hafnium oxide silicate, and tantalum oxide.

20. The memory array of claim 17, wherein the conductors couple to the gate structures by metal-filled vias.

21. The memory array of claim 20, wherein the conductors each extend along a third direction transverse to both the first and second directions.

22. The memory array of claim 20, wherein the metal-filled vias comprise a material selected from the following group: titanium nitride, tungsten, tungsten nitride, titanium, aluminum, tantalum nitride, polycrystalline silicon, and polycrystalline silicon germanium.

23. The memory array of claim 17, wherein the one of the gate structures of the first plurality of gate structures, the one of the gate structures of the second plurality of gate structures and the one of the channel structures form a memory cell controlled by the gate structures on the opposite sides of the channel structure.

24. The memory array of claim 16, wherein the gate enhancement layer comprises a material selected from the following the group: polycrystalline silicon and polycrystalline silicon germanium.

* * * * *